(12) United States Patent
Uehara et al.

(10) Patent No.: US 10,906,405 B2
(45) Date of Patent: Feb. 2, 2021

(54) POWER CONVERTER FOR RAILROAD VEHICLE

(71) Applicant: FUJI ELECTRIC CO., LTD., Kawasaki (JP)

(72) Inventors: Yoshihisa Uehara, Suzuka (JP); Jun Kanda, Suzuka (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 394 days.

(21) Appl. No.: 16/017,075

(22) Filed: Jun. 25, 2018

(65) Prior Publication Data

US 2019/0039461 A1 Feb. 7, 2019

(30) Foreign Application Priority Data

Aug. 1, 2017 (JP) .................. 2017-148944

(51) Int. Cl.
*B60L 9/24* (2006.01)
*H05K 7/20* (2006.01)
*B61C 3/00* (2006.01)

(52) U.S. Cl.
CPC .................. *B60L 9/24* (2013.01); *B61C 3/00* (2013.01); *H05K 7/20854* (2013.01); *H05K 7/20918* (2013.01); *B60L 2200/26* (2013.01); *B60L 2210/30* (2013.01); *B60L 2210/44* (2013.01)

(58) Field of Classification Search
CPC ......... B60L 9/24; B61C 3/00; H05K 7/20854; H05K 7/20863; H05K 7/20881; H05K 7/209; H05K 7/20909; H05K 7/20918; H05K 7/20936; H01L 23/3672; H02M 7/003; H02M 5/4585; H02M 7/487
See application file for complete search history.

(56) References Cited

U.S. PATENT DOCUMENTS

| | | | | |
|---|---|---|---|---|
| 6,031,720 A | * | 2/2000 | Crane, Jr. | ............. H01L 23/467 361/695 |
| 6,434,003 B1 | * | 8/2002 | Roy | ................... H05K 7/20927 165/104.22 |
| 7,367,385 B1 | * | 5/2008 | Materna | .................. F28F 1/025 165/146 |
| 8,159,823 B2 | * | 4/2012 | Murakami | ................ F28F 3/12 361/716 |
| 9,192,079 B2 | * | 11/2015 | Loth | ................... H05K 7/20918 |
| 9,943,007 B2 | * | 4/2018 | Enami | ................ H05K 7/20409 |
| 10,214,109 B2 | * | 2/2019 | Gohara | .................... B60K 1/00 |
| 2002/0043360 A1 | * | 4/2002 | Lee | ..................... H01L 23/4093 165/80.3 |
| 2010/0157531 A1 | * | 6/2010 | Mason | ..................... H01Q 1/02 361/697 |

(Continued)

FOREIGN PATENT DOCUMENTS

| JP | 2003-274671 A | 9/2003 |
|---|---|---|
| JP | 2004-229500 A | 8/2004 |

*Primary Examiner* — Jason C Smith

(74) *Attorney, Agent, or Firm* — Manabu Kanesaka

(57) ABSTRACT

In this power converter for a railroad vehicle, a cooling portion includes a first cooling portion arranged to block up an opening while ensuring watertightness and to come into contact with a semiconductor element through the opening, and a second cooling portion provided to be opposed to an outer surface of a power converter body not provided with the opening and adjacent to a side provided with the first cooling portion.

8 Claims, 12 Drawing Sheets

(56) References Cited

U.S. PATENT DOCUMENTS

| | | | | |
|---|---|---|---|---|
| 2010/0277871 | A1* | 11/2010 | Kitanaka | B60L 9/16 |
| | | | | 361/710 |
| 2012/0012294 | A1* | 1/2012 | Miki | H01L 23/467 |
| | | | | 165/185 |
| 2012/0235162 | A1* | 9/2012 | Isobe | H01L 23/473 |
| | | | | 257/77 |
| 2013/0025837 | A1* | 1/2013 | Takenaga | H01L 23/473 |
| | | | | 165/168 |
| 2013/0306291 | A1* | 11/2013 | Tung | H01L 23/3677 |
| | | | | 165/185 |
| 2013/0312940 | A1* | 11/2013 | Huang | H05K 7/20145 |
| | | | | 165/104.34 |
| 2014/0159225 | A1* | 6/2014 | Zushi | H01L 23/3735 |
| | | | | 257/690 |
| 2014/0168895 | A1* | 6/2014 | Liu | H01L 23/3672 |
| | | | | 361/697 |
| 2014/0268571 | A1* | 9/2014 | Kang | H05K 7/20 |
| | | | | 361/699 |
| 2014/0301041 | A1* | 10/2014 | Kitanaka | H05K 7/20909 |
| | | | | 361/697 |
| 2016/0106000 | A1* | 4/2016 | Tang-Kong | F28F 3/048 |
| | | | | 165/80.3 |
| 2016/0134177 | A1* | 5/2016 | Itoh | H02K 9/06 |
| | | | | 105/59 |
| 2017/0341521 | A1* | 11/2017 | Kaneko | H05K 7/20909 |
| 2018/0279502 | A1* | 9/2018 | Kamiya | H05K 7/20409 |
| 2018/0310431 | A1* | 10/2018 | Kamiya | B61D 27/0072 |
| 2019/0039461 | A1* | 2/2019 | Uehara | H05K 7/20854 |
| 2019/0148259 | A1* | 5/2019 | Takizawa | H05K 7/20936 |
| | | | | 361/698 |

* cited by examiner

[FIRST EMBODIMENT]

FIG.13 [THIRD EMBODIMENT]
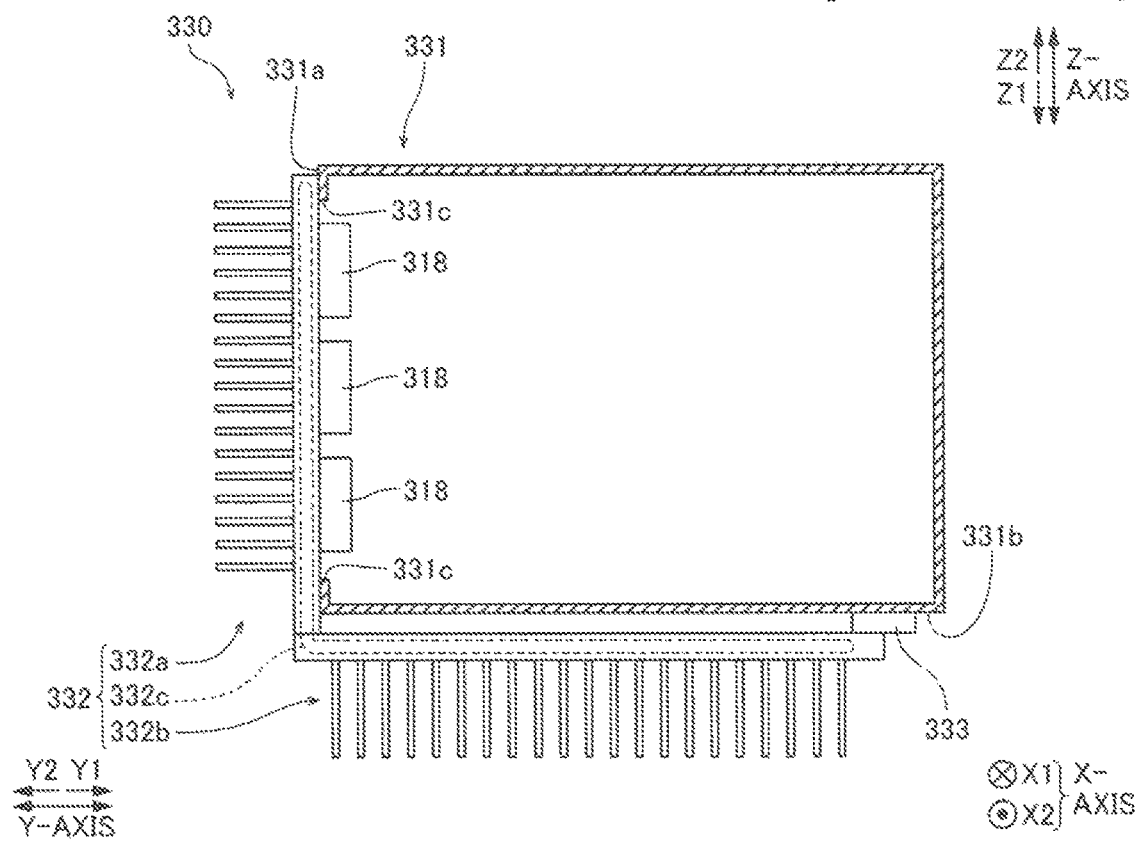
FIG.14 [FOURTH EMBODIMENT]
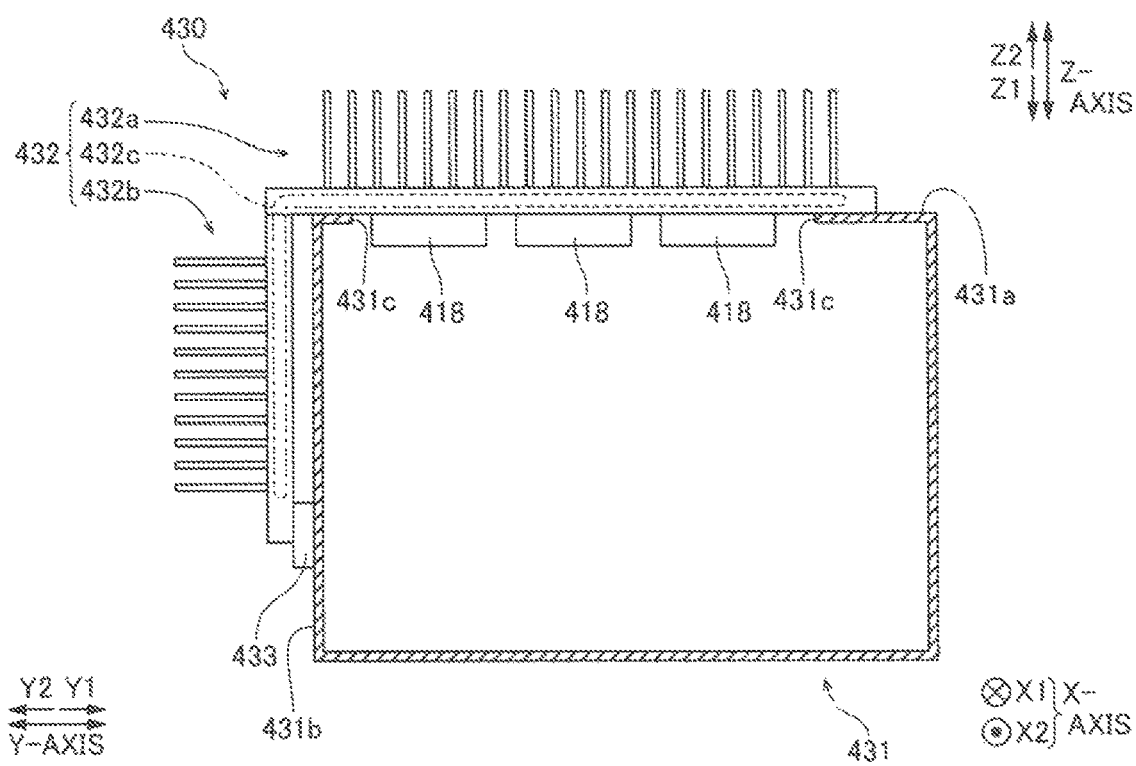

[FIFTH EMBODIMENT]

[MODIFICATION]

POWER CONVERTER FOR RAILROAD VEHICLE

CROSS-REFERENCE TO RELATED APPLICATION

The priority application number JP2017-148944, Power Converter for Railroad Vehicle, filed Aug. 1, 2017, Yoshihisa Uehara, Jun Kanda, upon which this patent application is based, is hereby incorporated by reference.

BACKGROUND OF THE INVENTION

Field of the Invention

The present invention relates to a power converter for a railroad vehicle, and more particularly, it relates to a power converter for a railroad vehicle including a power converter body loaded on a railroad vehicle and provided therein with a semiconductor element and a cooling portion provided outside the power converter body for radiating heat from inside the power converter body.

Description of the Background Art

A power converter for a railroad vehicle including a power converter body loaded on a railroad vehicle and provided therein with a semiconductor element and a cooling portion provided outside the power converter body for radiating heat from inside the power converter body is known in general, as disclosed in Japanese Patent Laying-Open No. 2003-274671, for example.

Japanese Patent Laid-Open No. 2003-274671 discloses a power converter for a railroad vehicle including heat receiving portions (cooling portions) provided on the bottom surface and side surfaces of a power converter body suspended from the underfloor of a vehicle body respectively for radiating heat from inside the power converter body and semiconductor elements provided inside the power converter body and connected to the heat receiving portions respectively.

In the power converter for a railroad vehicle according to Japanese Patent Laid-Open No. 2003-274671, openings are formed on the outer surfaces (bottom and side surfaces) of the power converter body provided with the semiconductor elements, thereby directly connecting the heat receiving portions (cooling portions) to the semiconductor elements.

In the power converter for a railroad vehicle described in Japanese Patent Laid-Open No. 2003-274671, however, the openings are formed on the plurality of surfaces (bottom and side surfaces) of the power converter body provided with the heat receiving portions (cooling portions). Therefore, waterproof structures must be applied to the plurality of surfaces respectively. In the power converter for a railroad vehicle according to Japanese Patent Laid-Open No. 2003-274671, therefore, the number of manufacturing steps and labor for maintenance may conceivably be increased due to the waterproof structures applied to the plurality of portions for preventing liquids such as rainwater from entering into the power converter body loaded with the semiconductor elements and the like.

SUMMARY OF THE INVENTION

The present invention has been proposed in order to solve the aforementioned problem, and an object of the present invention is to provide a power converter for a railroad vehicle capable of decreasing the number of manufacturing steps and labor for maintenance resulting from application of a waterproof structure while ensuring a heat radiation performance.

In order to attain the aforementioned object, a power converter for a railroad vehicle according to an aspect of the present invention includes a power converter body loaded on a railroad vehicle and provided therein with a semiconductor element and a cooling portion including a radiation fin portion having a plurality of fins and provided outside the power converter body for radiating heat from inside the power converter body, while an opening is formed only on the outer surface of any one of the upper, lower and side surfaces of the power converter body, and the cooling portion includes a first cooling portion having a first radiation fin portion and arranged to block up the opening while ensuring watertightness and to come into contact with the semiconductor element through the opening and a second cooling portion having a second radiation fin portion and provided to be opposed to the outer surface of a side of the power converter body not provided with the opening and adjacent to the side provided with the first cooling portion.

In the power converter according to this aspect of the present invention, as hereinabove described, the cooling portion includes the first cooling portion having the first radiation fin portion and arranged to block up the opening while ensuring watertightness and to come into contact with the semiconductor element through the opening and the second cooling portion having the second radiation fin portion and provided to be opposed to the outer surface of the side of the power converter body not provided with the opening and adjacent to the side provided with the first cooling portion. Thus, watertightness of the power converter body can be ensured by simply ensuring watertightness only on the outer surface of the side of the power converter body provided with the first cooling portion also when a heat radiation performance of the cooling portion is ensured by arranging the first and second cooling portions on the outer surfaces of a plurality of sides of the power converter body respectively. As compared with a case where waterproof structures must be applied to a plurality of surfaces respectively, therefore, watertightness of the power converter body can be ensured by simply applying a waterproof structure to only one surface. Consequently, the number of manufacturing steps and labor for maintenance resulting from application of a waterproof structure can be reduced while ensuring a heat radiation performance in the power converter for a railroad vehicle.

In the aforementioned power converter for a railroad vehicle according to this aspect, the second cooling portion is preferably arranged to be separated from and opposed to the outer surface of the power converter body. According to this structure, heat can be radiated from the second cooling portion also between the second cooling portion, separated from and opposed to the outer surface of the power converter body, and the outer surface. Further, the second cooling portion is so separated from the outer surface of the power converter body that heat radiated from the second cooling portion can be inhibited from being transferred (returned) to the power converter body from the outer surface thereof. Consequently, heat radiation in the power converter body can be efficiently performed also when the opening is formed only on the side of the power converter body provided with the first cooling portion.

In this case, the power converter for a railroad vehicle preferably further includes a spacer provided between the second cooling portion and the outer surface of the side of the power converter body provided with the second cooling portion to be held between the second cooling portion and the power converter body. According to this structure, the state where the second cooling portion and the outer surface of the power converter body are separated from and opposed to each other can be easily maintained due to the spacer.

In the aforementioned power converter for a railroad vehicle according to this aspect, the cooling portion preferably further includes a pipelike member arranged across the first cooling portion and the second cooling portion, and the pipelike member is preferably configured to perform heat conduction between the first cooling portion provided to come into contact with the semiconductor element for directly receiving heat from inside the power converter body and the second cooling portion. According to this structure, heat from inside the power converter body can be efficiently transferred also to the second cooling portion, to which this heat is not directly transferred, through the pipelike member. Consequently, the heat from inside the power converter body can be efficiently dispersed to the first and second cooling portions, whereby the overall heat radiation efficiency (heat radiation performance) of the cooling portion can be improved.

In this case, the pipelike member is preferably provided to come into contact with the semiconductor element. According to this structure, heat generated from the semiconductor element can be easily transferred to the pipelike member. Consequently, the heat from inside the power converter body can be more efficiently transferred to the second cooling portion through the pipelike member.

In the aforementioned structure having the pipelike member coming into contact with the semiconductor element, the pipelike member is preferably formed to have a rectangular section. According to this structure, the contact area between the pipelike member and the semiconductor element can be increased as compared with a case where the pipelike member is formed to have a circular section, for example. Consequently, heat generated from the semiconductor element can be efficiently transferred to the pipelike member.

The aforementioned power converter for a railroad vehicle according to this aspect preferably further includes an annular waterproof member provided between the power converter body and the first cooling portion to ensure watertightness in the vicinity of the outer peripheral portion of the opening. According to this structure, watertightness of the power converter body can be reliably ensured.

BRIEF DESCRIPTION OF THE DRAWINGS

FIG. 13 is a side sectional view showing a power converter according to a third embodiment of the present invention;

FIG. 14 is a side sectional view showing a power converter according to a fourth embodiment of the present invention;

DESCRIPTION OF THE PREFERRED EMBODIMENTS

Embodiments of the present invention are now described with reference to the drawings.

First Embodiment

Figure 1:
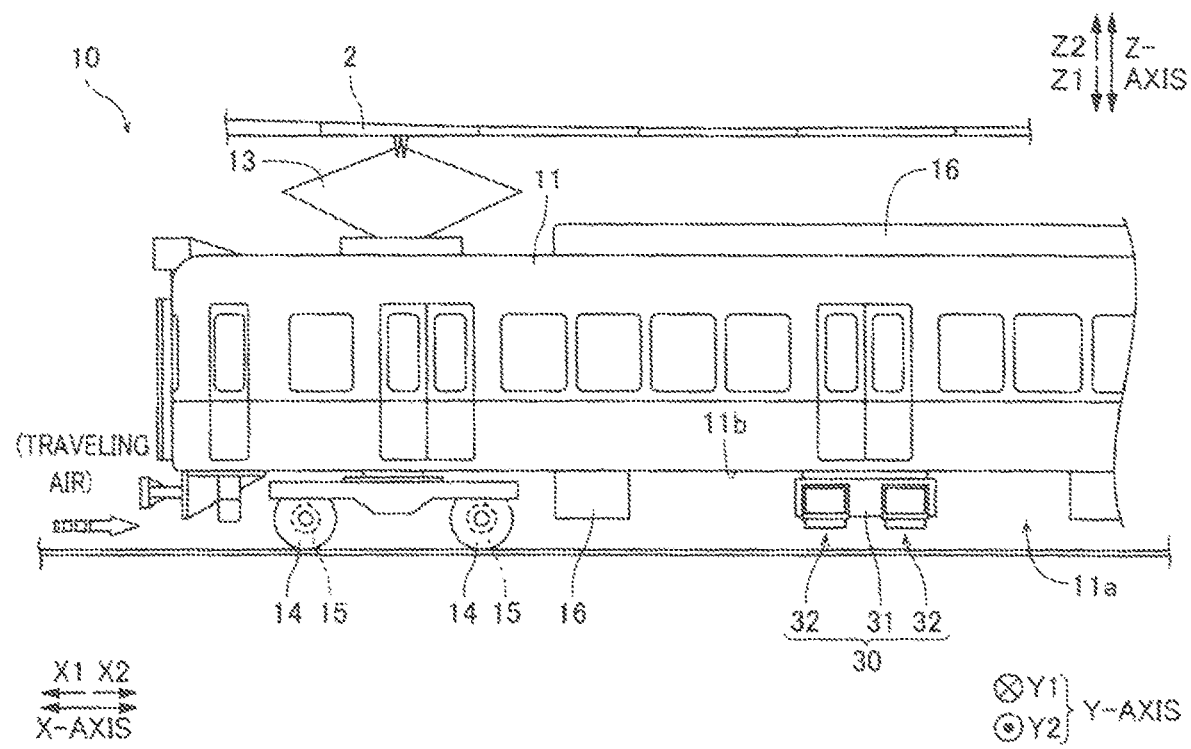
FIG. 1 is a side elevational view showing a railroad vehicle including a power converter according to a first embodiment of the present invention.

The structure of a power converter 30 for a railroad vehicle 10 according to a first embodiment of the present invention is described with reference to FIGS. 1 to 10. As shown in FIG. 1, the power converter 30 is suspended from and fixed to a lower surface 11b of a vehicle body 11 in an underfloor space 11a of the vehicle body 11. The power converter 30 is an example of the "power converter for a railroad vehicle" in the scope of claims for patent. In the following description, the traveling direction of the railroad vehicle 10 is referred to as an X-axis direction, a crosstie direction orthogonal to the X-axis direction is referred to as a Y-axis direction, and the vertical direction orthogonal to both of the X- and Y-axis directions is referred to as a Z-axis direction.

First, a schematic structure of the railroad vehicle 10 including the power converter 30 according to the first embodiment of the present invention is briefly described with reference to FIG. 1. The railroad vehicle 10 includes the vehicle body 11, a pantagraph 13 receiving (collecting) power supplied to an overhead wire 2, induction motors 15 (shown by broken lines) rotating driving wheels 14 through the power from the overhead wire 2 and a plurality of other devices 16 such as an air conditioner, a control device and the like, as shown in FIG. 1. The power converter 30 has a role of controlling rotation of the induction motors 15 by switching semiconductor elements 18 (see FIG. 2) thereby converting the power from the overhead wire 2 in traveling of the railroad vehicle 10.

Figure 2:
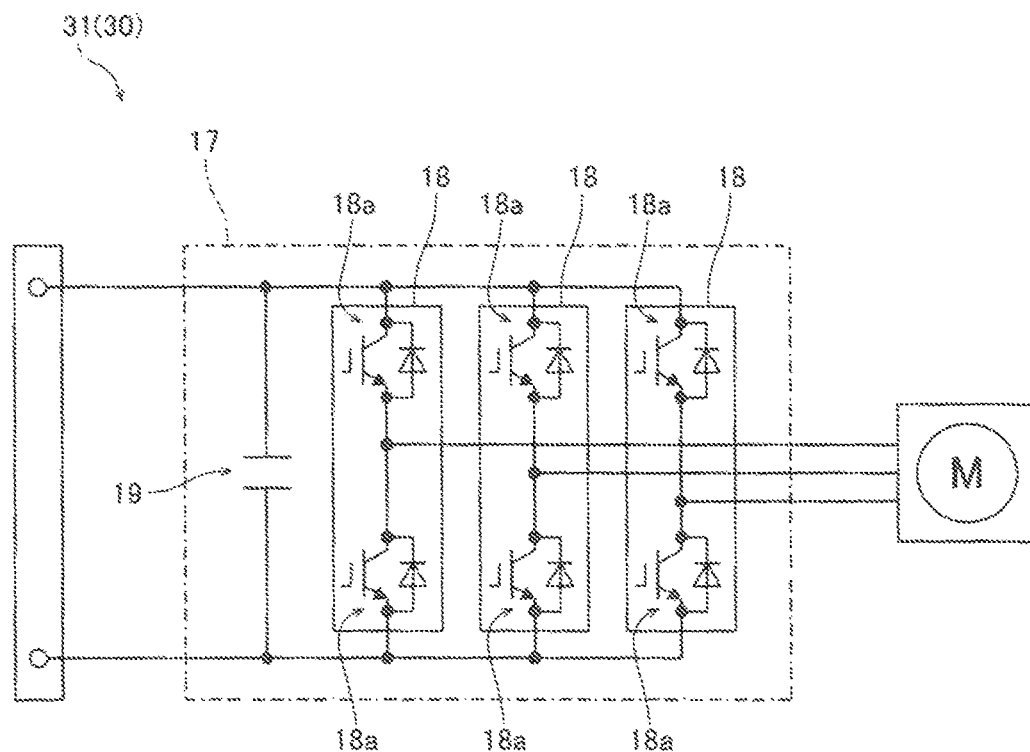
FIG. 2 illustrates the circuit structure of the power converter according to the first embodiment of the present invention.

A circuit structure related to the power converter 30 is now briefly described with reference to FIG. 2. As shown in FIG. 2, the power converter 30 includes an inverter unit 17 structured as a three-phase inverter. The inverter unit 17 includes three semiconductor elements 18 and a capacitor 19. Each semiconductor element 18 includes two switching elements 18a. The power converter 30 further includes a converter portion (not shown). The converter portion and the capacitor 19 are configured to convert (rectify) alternating current inputted in the power converter 30 to direct current. The inverter unit 17 is configured to convert the direct current rectified by the converter portion and the capacitor 18 to alternating current and to output the same.

(Structure of Power Converter)

Figure 3:
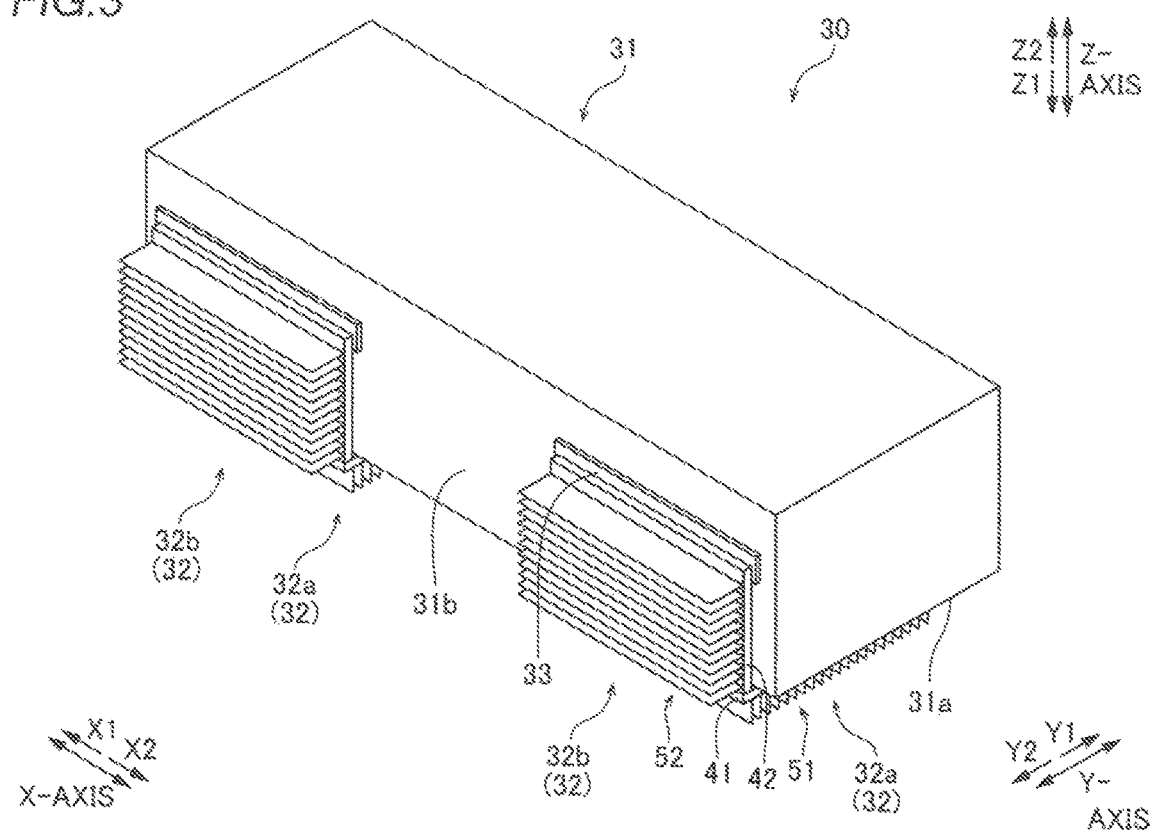
FIG. 3 is a perspective view showing the power converter according to the first embodiment of the present invention.

The structure of the power converter 30 according to the first embodiment of the present invention is described in detail with reference to FIGS. 3 to 8. The power converter 30 includes a semiconductor device 31 for performing power conversion and two cooling portions 32 for radiating heat outward from inside the semiconductor device 31, as shown in FIG. 3. The two cooling portions 32 are arranged at a prescribed distance along the X-axis direction corresponding to the extensional direction of the vehicle body 11. The semiconductor device 31 is an example of the "power converter body" in the scope of claims for patent.

Figure 4:
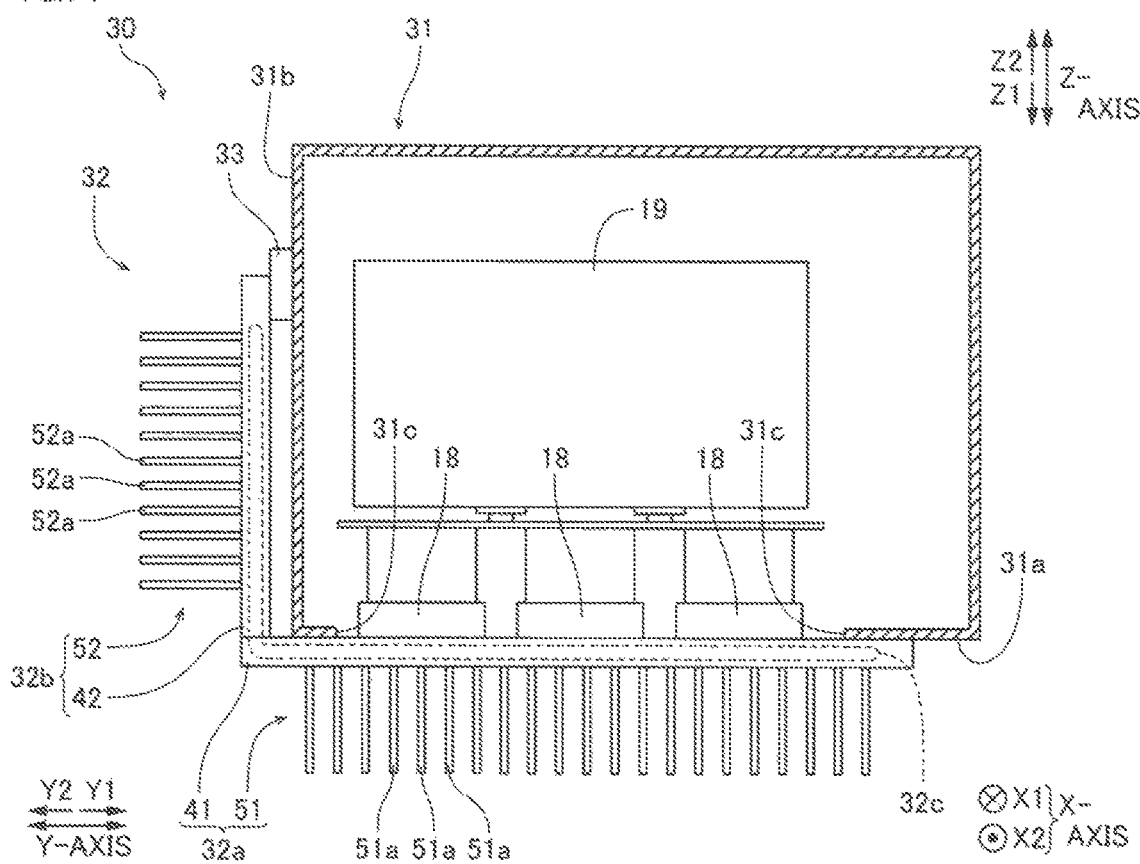
FIG. 4 is a side sectional view showing the power converter according to the first embodiment of the present invention.
Figure 5:
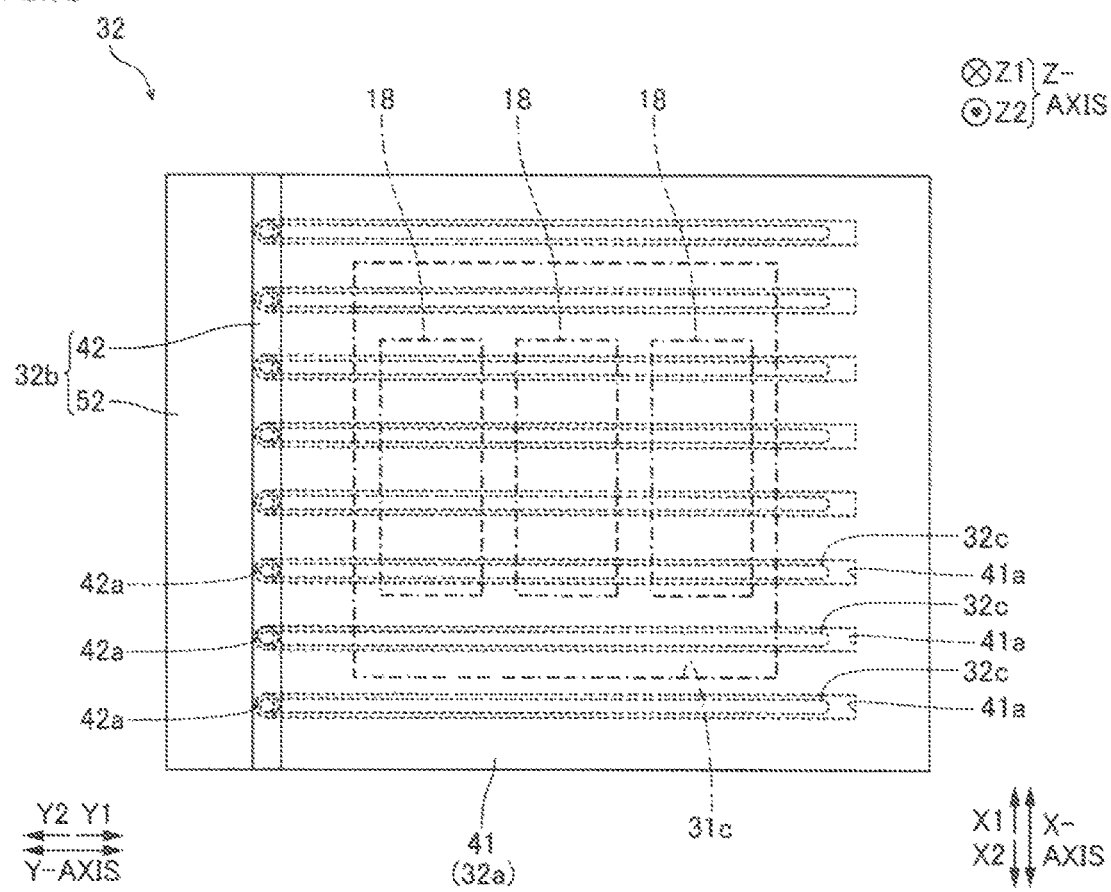
FIG. 5 is a plan view showing a cooling portion of the power converter according to the first embodiment of the present invention.

The semiconductor device 31 is provided therein with electronic components such as the semiconductor elements 18 and the capacitor 19, as shown in FIG. 4. An opening 31c is formed only on an outer surface 31a corresponding to the lower surface (along arrow Z1) of the semiconductor device 31. The semiconductor elements 18 are arranged in line along the crosstie direction (Y-axis direction) so that the longitudinal direction thereof is along the traveling direction (X-axis direction) of the railroad vehicle 10 and the positions in the traveling direction (X-axis direction) align with each other, as shown in FIGS. 4 and 5.

The cooling portion 32 includes a first cooling portion 32a provided on the lower surface (along arrow Z1) of the semiconductor device 31, a second cooling portion 32b provided on a side surface (along arrow Y2) of the semiconductor device 31 and a plurality of heat pipes 32c arranged across the first and second cooling portions 32a and 32b. The side surface (along arrow Y2) of the semiconductor device 31 provided with the second cooling portion 32b is adjacent to the lower surface (along arrow Z1) of the semiconductor device 31 provided with the first cooling portion 32a. The heat pipes 32c are examples of the "pipe-like member" in the scope of claims for patent.

The first cooling portion 32a includes a heat slinger 41 in the form of a flat plate arranged to come into contact with the outer surface 31a corresponding to the lower surface (along arrow Z1) of the semiconductor device 31 and a first radiation fin portion 51 including a plurality of fins 51a.

The heat slinger 41 is arranged to come into contact with the outer surface 31a corresponding to the lower surface (along arrow Z1) of the semiconductor device 31. Further, the heat slinger 41 is arranged to come into contact with the semiconductor elements 18 through the opening 31c. Thus, heat generated from the semiconductor elements 18 is directly transferred to the heat slinger 41.

The first radiation fin portion 51 is mounted on the lower surface (along arrow Z1) of the heat slinger 41. The first radiation fin portion 51 is constituted of the plurality of fins 51a provided to extend along arrow Z1. Thus, the first cooling portion 32a is capable of transferring heat generated from the semiconductor elements 18 to the first radiation fin portion 51 through the heat slinger 41 and radiating the same outward from the power converter 30.

The second cooling portion 32b includes a heat slinger 42 in the form of a flat plate arranged to be separated from and opposed to another outer surface 31b corresponding to the side surface (along arrow Y2) of the semiconductor device 31 and a second radiation fin portion 52 including a plurality of fins 52a.

The heat slinger 42 is configured to easily maintain the state separated from and opposed to the outer surface 31b corresponding to the side surface (along arrow Y2) of the semiconductor device 31, due to a spacer 33 held between the same and the outer surface 31b. An end portion of the heat slinger 42 along arrow Z1 is connected with an end portion of the heat slinger 41 along arrow Y2. Thus, heat generated from the semiconductor elements 18 is indirectly transferred to the heat slinger 42 through the heat slinger 41.

The second radiation fin portion 52 is mounted on a side surface (along arrow Y2) of the heat slinger 42. The second radiation fin portion 52 is constituted of the plurality of fins 52a provided to extend along arrow Y2. Thus, the second cooling portion 32b is capable of transferring heat generated from the semiconductor elements 18 and indirectly transferred thereto through the heat slinger 41 to the second radiation fin portion 52 through the heat slinger 42 and radiating the same outward from the power converter 30.

Figure 6:
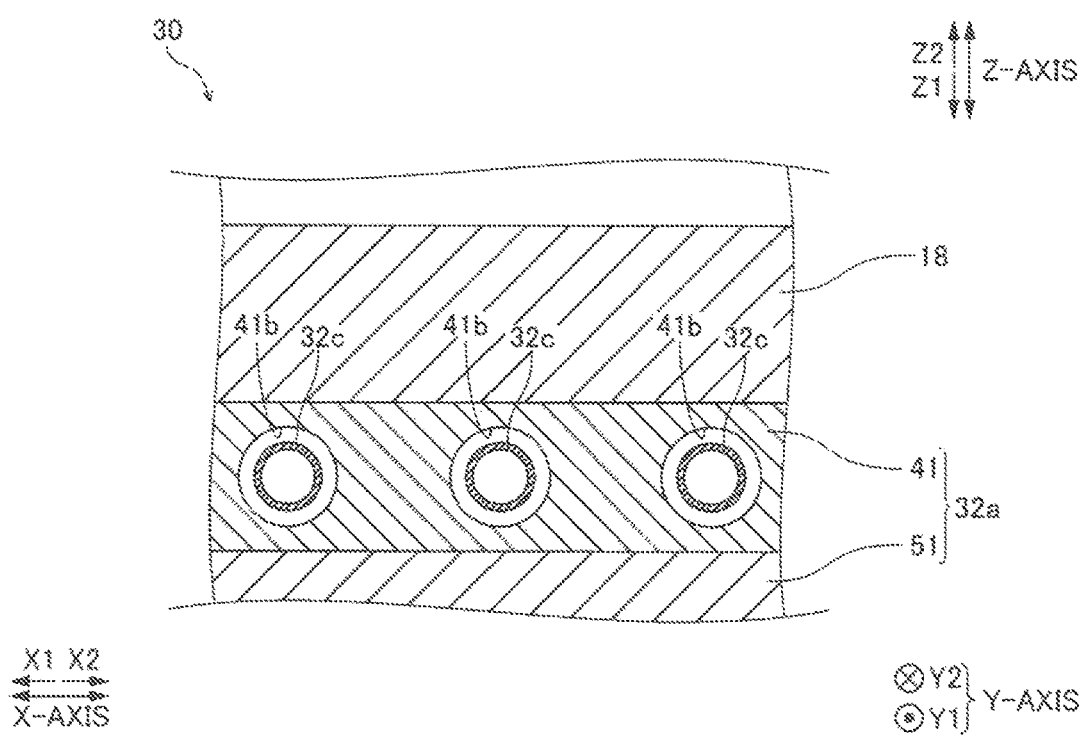
FIG. 6 is a sectional view showing a state of pipelike members of the cooling portion of the power converter according to the first embodiment of the present invention.

As shown in FIGS. 5 and 6, the heat pipes 32c are arranged to be embedded in hole portions 41a and 42a formed in the heat slingers 41 and 42 respectively. The heat pipes 32c are fixed in a state embedded in the hole portions 41a and 42a through thermal compounds (gel-type heat conduction substances). As shown in FIG. 4, the heat pipes 32c are L-shaped as viewed from the X-axis direction. Further, the heat pipes 32c are formed to have circular sections, as shown in FIG. 6.

The heat pipes 32c are configured to be capable of efficiently conducting heat from first end portions to second end portions thereof through evaporation and condensation of a liquid provided therein. Thus, efficient heat conduction can be performed between the heat slingers 41 and 42 through the heat pipes 32c. Therefore, heat generated from the semiconductor device 31 can be efficiently transferred also to the second cooling portion 32b, to which this heat is not directly transferred.

Figure 7:
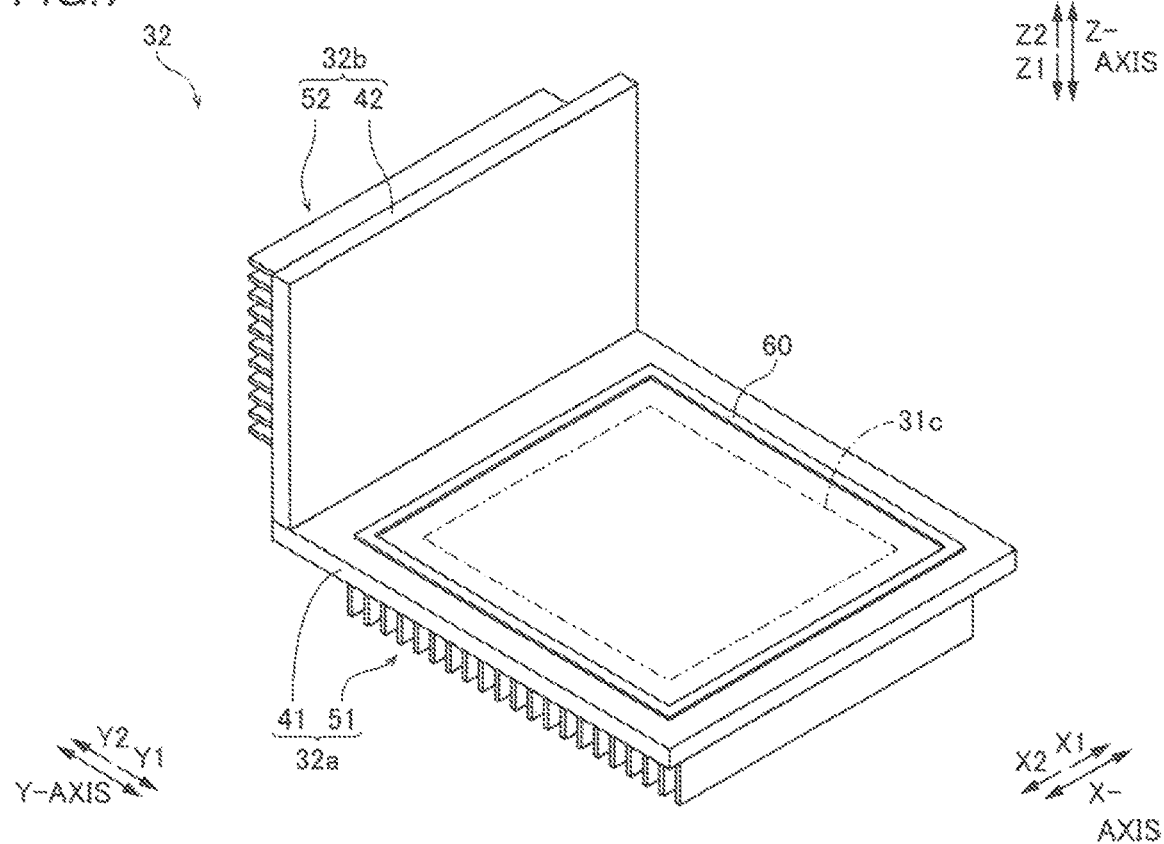
FIG. 7 is a perspective view for illustrating a waterproof member of the power converter according to the first embodiment of the present invention.
Figure 8:
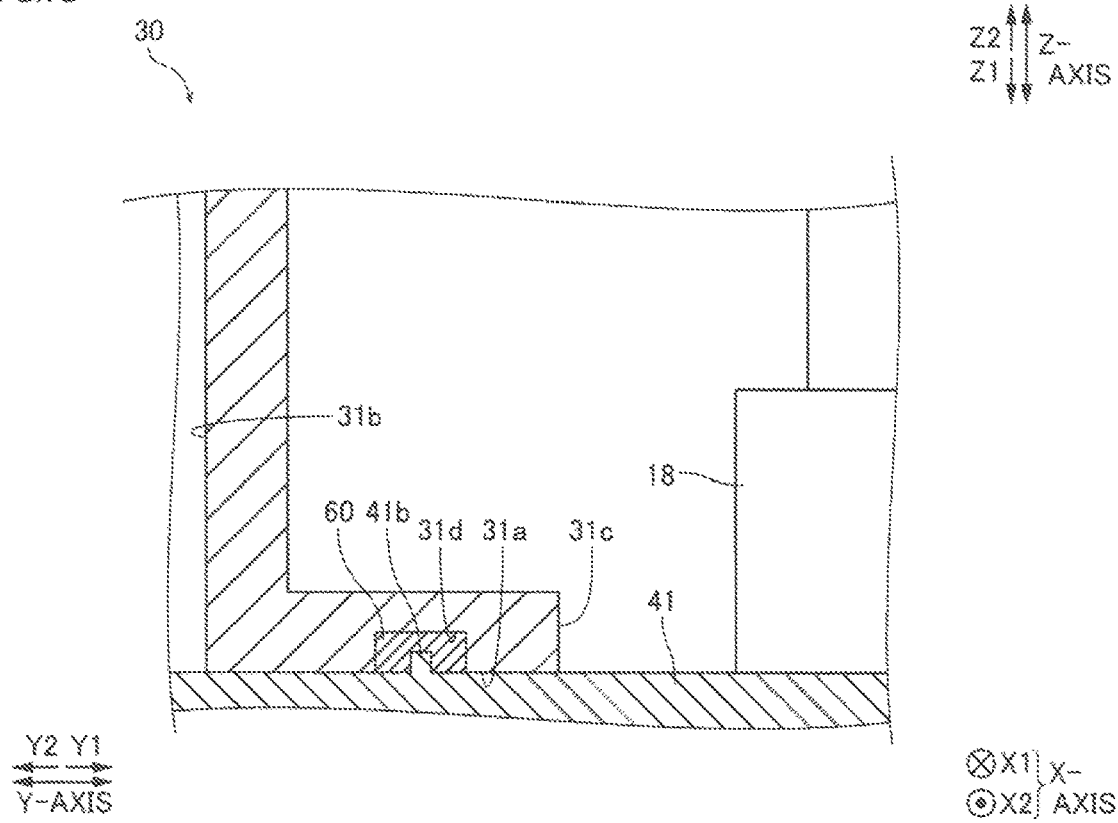
FIG. 8 is a side sectional view for illustrating the waterproof member of the power converter according to the first embodiment of the present invention.

A waterproof gasket 60 for ensuring watertightness in the semiconductor device 31 is described with reference to FIGS. 7 and 8. In the power converter 30, the annular waterproof gasket 60 is mounted on a portion of the heat slinger 41 outward beyond the portion mounted with the semiconductor elements 18, as shown in FIG. 7. The waterproof gasket 60 is configured to be fitted into a space between a recess portion 31d formed on the outer surface 31a corresponding to the lower surface (along arrow Z1) of the semiconductor device 31 to dent along arrow Z2 and a projecting portion 41b formed on a surface of the heat slinger 41 closer to the semiconductor device 31 to protrude along arrow Z2 in the vicinity of the outer peripheral portion of the opening 31c of the semiconductor device 31, as shown in FIG. 8. Thus, the waterproof gasket 60 can block up the opening 31c while ensuring watertightness.

(Method of Assembling Power Converter)

A method of assembling the power converter 30 is now briefly described with reference to FIGS. 9 and 10.

Figure 9:
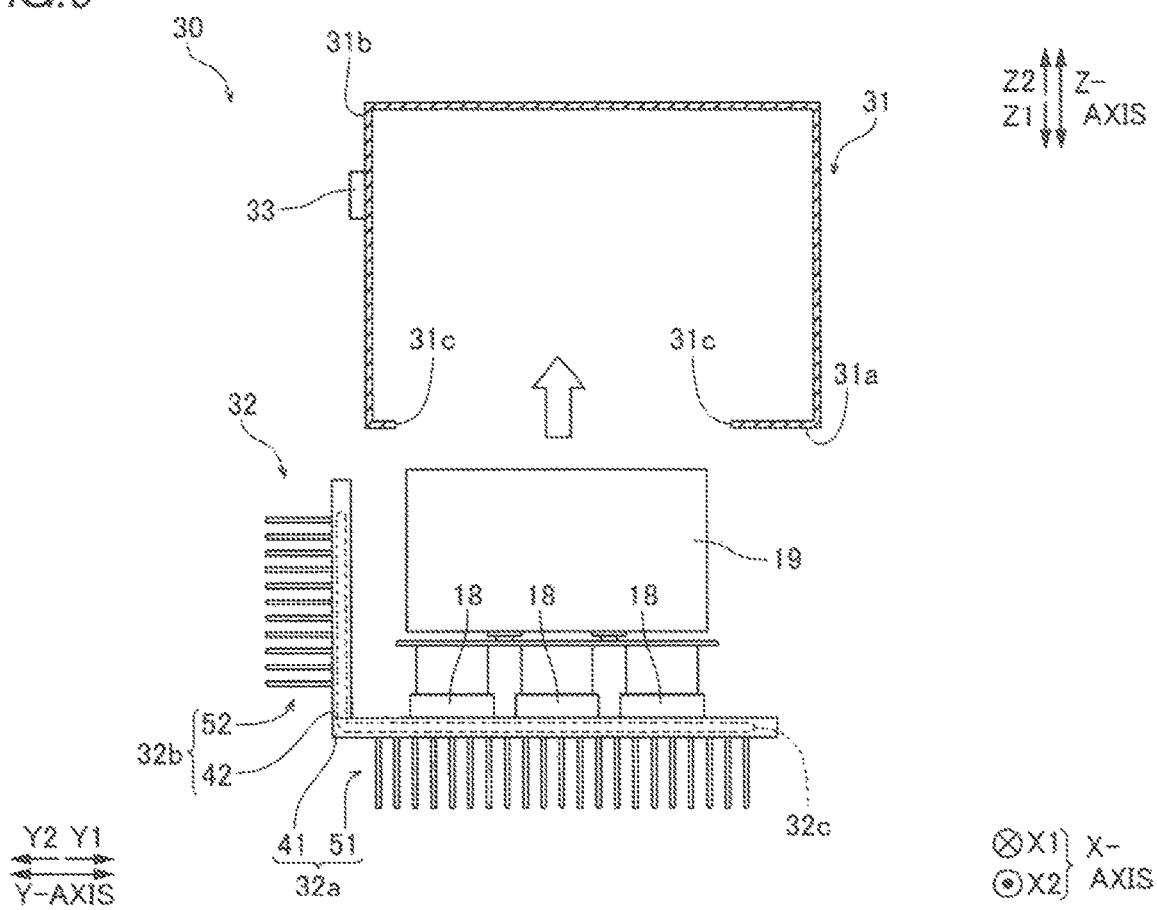
FIG. 9 is a side sectional view showing assembling of the power converter according to the first embodiment of the present invention.
Figure 10:
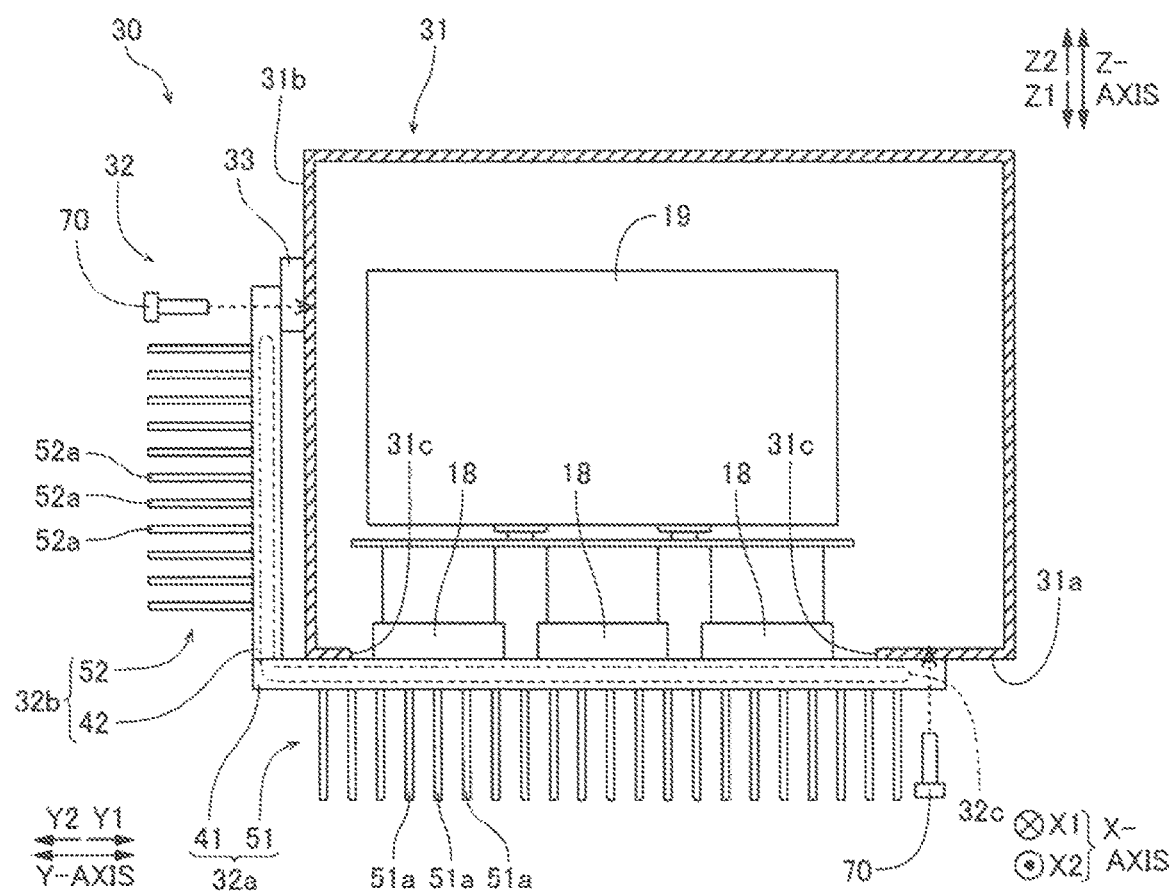
FIG. 10 is another side sectional view showing assembling of the power converter according to the first embodiment of the present invention.

As shown in FIG. 9, the spacer 33 is first fixed to the outer surface 31b corresponding to the side surface (along arrow Y2) of the semiconductor device 31 with screws or the like. Further, the semiconductor elements 18 are mounted on the surface of the heat slinger 41 along arrow Z2. At this time, other electronic components such as the capacitor 19 loaded in the semiconductor device 31 are also fixed to sides of the semiconductor elements 18 along arrow Z2. In addition, the waterproof gasket 60 is also fitted with the projecting portion 41b formed on the surface of the heat slinger 41 closer to the semiconductor device 31.

Then, the cooling portion 32 mounted with the semiconductor elements 18 and the like is approached to the semiconductor device 31 until the heat slinger 41 comes into contact with the outer surface 31a corresponding to the lower surface (along arrow Z1) of the semiconductor device 41, so that the semiconductor elements 18 are arranged in the semiconductor device 31 through the opening 31c. Then, the waterproof gasket 60 is fitted with the recess portion 31d formed on the outer surface 31a corresponding to the lower surface (along arrow Z1) of the semiconductor device 31. At this time, the spacer 33 fixed to the outer surface 31b corresponding to the side surface (along arrow Y2) of the semiconductor device 31 and the heat slinger 42 are in contact with each other.

Then, the semiconductor device 31 and the cooling portion 32 are fixed to each other through a plurality of bolts 70. As shown in FIG. 8, a plurality of openings (not shown) for mounting the bolts 70 is previously formed on each of the outer surface 31a corresponding to the lower surface (along arrow Z1) of the semiconductor device 31 and the heat slinger 41. Further, a plurality of openings (not shown) for mounting the bolts 70 is previously formed also on each of the outer surface 31b corresponding to the side surface (along arrow Y2) of the semiconductor device 31 and the heat slinger 42. In order to simplify the illustration, FIG. 8 shows only two mounting portions for the bolts 70. The power converter 30 provided with the cooling portion 32 including the first cooling portion 32a arranged to come into contact with the semiconductor elements 18 through the opening 31c while blocking up the opening 31c in the state ensuring watertightness and the second cooling portion 32b provided to be opposed to the outer surface 31b of the side of the semiconductor device 31 not provided with the opening 31c is assembled in this manner.

Effects of First Embodiment

According to the first embodiment, the following effects can be attained:

In the power converter 30 according to the first embodiment, as hereinabove described, the cooling portion 32 is configured to include the first cooling portion 32a having the first radiation fin portion 51 and arranged to block up the opening 31c while ensuring watertightness and to come into contact with the semiconductor elements 18 through the opening 31c and the second cooling portion 32c having the second radiation fin portion 52 and provided to be opposed to the outer surface 31b of the side of the semiconductor device 31 not provided with the opening 31c and adjacent to the side provided with the first cooling portion 32a. Thus, watertightness of the semiconductor device 31 can be ensured by simply ensuring watertightness only on the outer surface 31a of the side of the semiconductor device 31 provided with the first cooling portion 32a also when a heat radiation performance of the cooling portion 32 is ensured by arranging the first and second cooling portions 32a and 32b are arranged on the outer surfaces 31a and 31b of the plurality of sides of the semiconductor device 31 respectively. As compared with a case where waterproof structures must be provided on a plurality of surfaces respectively, therefore, watertightness of the semiconductor device 31 can be ensured by simply providing a waterproof structure only on one surface. Consequently, the number of manufacturing steps and labor for maintenance resulting from application of a waterproof structure can be reduced while ensuring a heat radiation performance in the power converter 30.

In the power converter 30 according to the first embodiment, as hereinabove described, the second cooling portion 32b is arranged to be separated from and opposed to the outer surface 31b of the semiconductor device 31. Thus, heat can be radiated from the second cooling portion 32b also between the second cooling portion 32b, separated from and opposed to the outer surface 31b of the semiconductor device 31, and the outer surface 31b. Further, the second cooling portion 32b is so separated from the outer surface 31b of the semiconductor device 31 that heat radiated from the second cooling portion 32b can be inhibited from being transferred (returned) to the semiconductor device 31 from the outer surface 31b thereof. Consequently, heat radiation can be efficiently performed in the semiconductor device 31 also when the opening 31c is formed only on the side of the semiconductor device 31 provided with the first cooling portion 32a.

The power converter 30 according to the first embodiment is configured to further include the spacer 33 provided between the second cooling portion 32b and the outer surface 31b of the side of the semiconductor device 31 provided with the second cooling portion 32b to be held between the second cooling portion 32b and the semiconductor device 31, as hereinabove described. Thus, the state where the second cooling portion 32b and the outer surface 31b of the semiconductor device 31 are separated from and opposed to each other can be easily maintained due to the spacer 33.

In the power converter 30 according to the first embodiment, the cooling portion 23 further includes the heat pipes 32c arranged across the first and second cooling portions 32a and 32b, and the heat pipes 32c are configured to perform heat conduction between the first cooling portion 32a provided to come into contact with the semiconductor elements 18 for directly receiving heat from inside the semiconductor device 31 and the second cooling portion 32*b*, as hereinabove described. Thus, heat from inside the semiconductor device 31 can be efficiently transferred also to the second cooling portion 32*b*, to which this heat is not directly transferred, through the heat pipes 32*c*. Consequently, the heat from inside the semiconductor device 31 can be efficiently dispersed to the first and second cooling portions 32*a* and 32*b*, whereby the overall heat radiation efficiency (heat radiation performance) of the cooling portion 32 can be improved.

As hereinabove described, the semiconductor device 31 according to the first embodiment is configured to further include the annular waterproof gasket 60 provided between the semiconductor device 31 and the first cooling portion 32*a* to ensure watertightness in the vicinity of the outer peripheral portion of the opening 31*c*. Thus, watertightness of the semiconductor device 31 can be reliably ensured.

Second Embodiment

Figure 11:
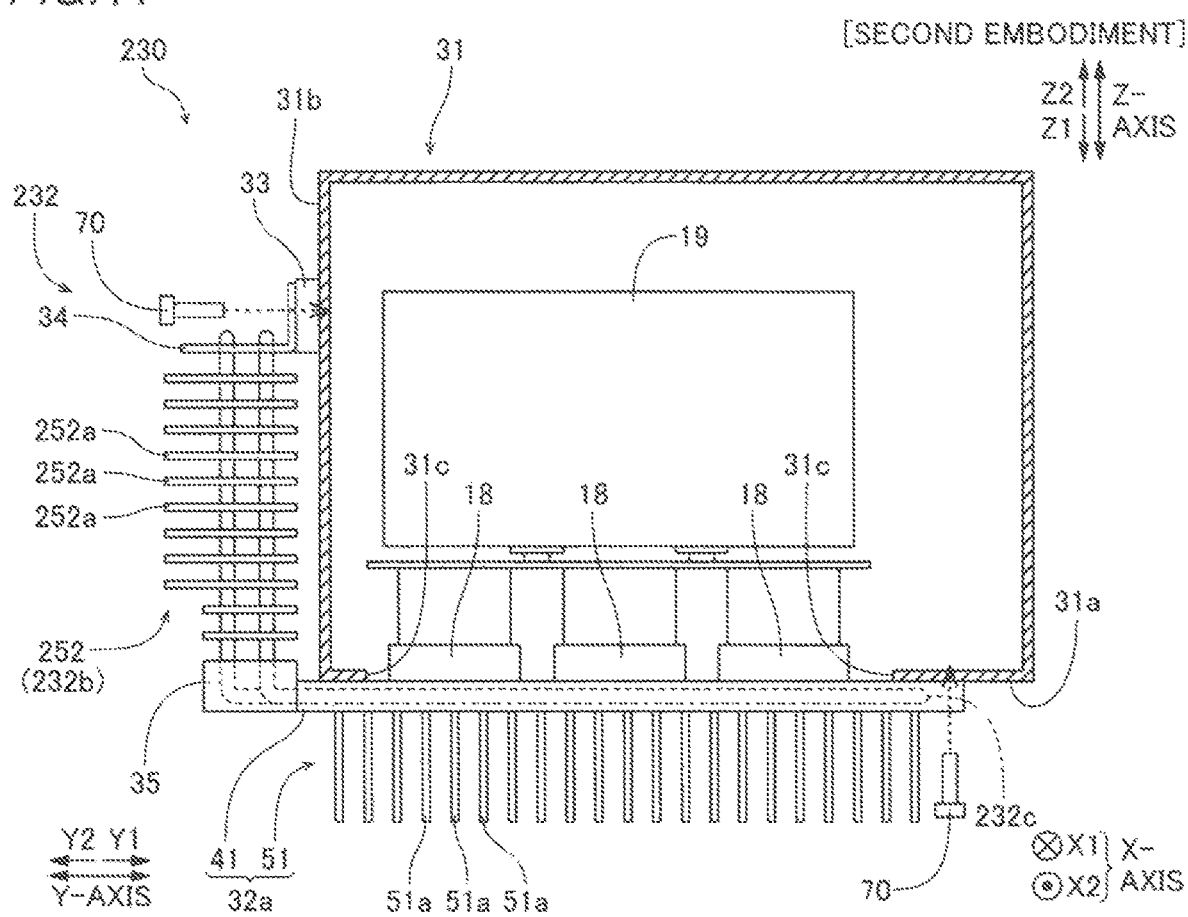
FIG. 11 is a side sectional view showing a power converter according to a second embodiment of the present invention.
Figure 12:
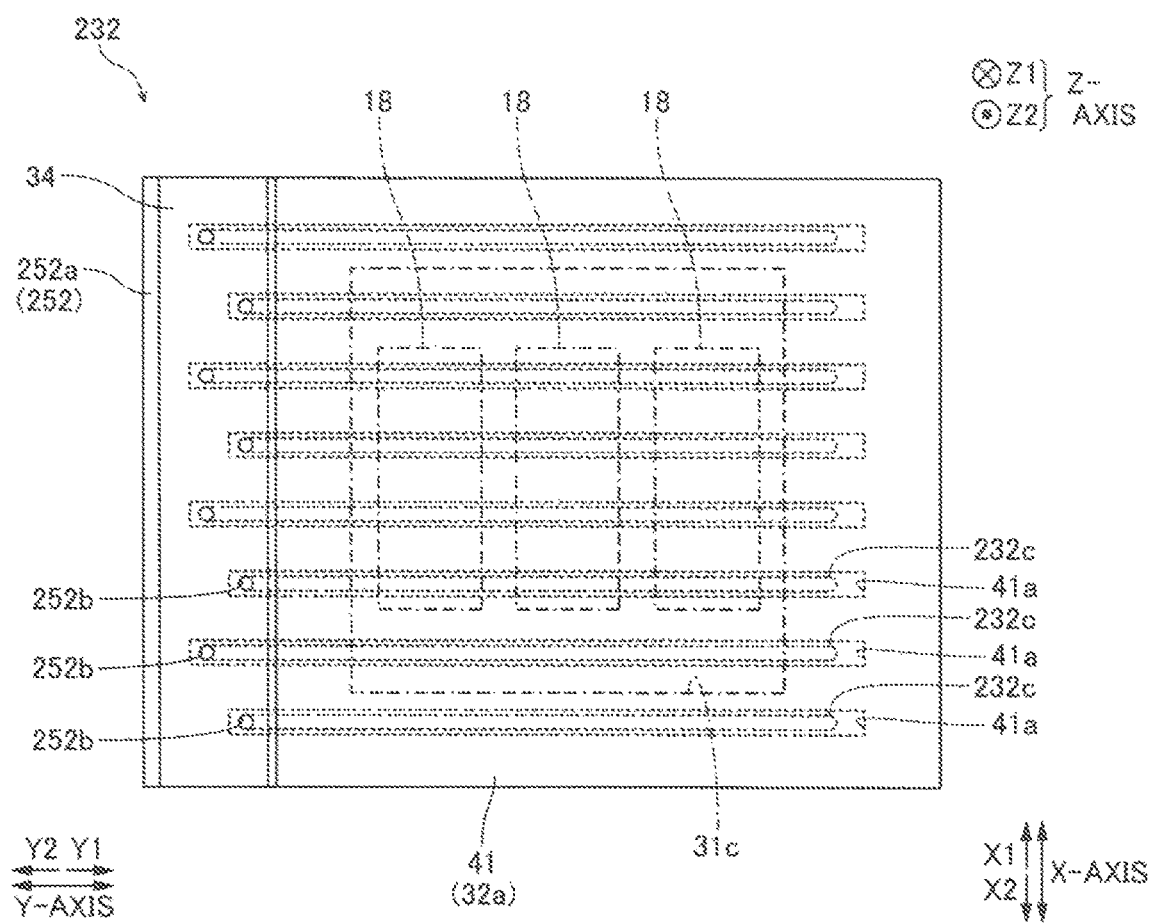
FIG. 12 is a plan view showing a cooling portion of the power converter according to the second embodiment of the present invention.

A second embodiment of the present invention is now described with reference to FIGS. 11 and 12. According to the second embodiment of the present invention, a second cooling portion 232*b* has a structure different from that of the second cooling portion 32*b* according to the aforementioned first embodiment. Referring to FIGS. 11 and 12, structures similar to those of the aforementioned first embodiment are denoted by the same reference signs.

A power converter 230 according to the second embodiment of the present invention includes a semiconductor device 31 and a cooling portion 232, as shown in FIG. 11. The cooling portion 232 includes a first cooling portion 32*a*, the second cooling portion 232*b* provided on a side surface (along arrow Y2) of the semiconductor device 31 and a plurality of heat pipes 232*c* arranged across the first and second cooling portions 32*a* and 232*b*. In the semiconductor device 31, the lower surface (along arrow Z1) provided with the first cooling portion 32*a* and the side surface (along arrow Y2) provided with the second cooling portion 232*b* are adjacent to each other. The power converter 230 is an example of the "power converter for a railroad vehicle" in the scope of claims for patent. The heat pipes 232*c* are examples of the "pipelike member" in the scope of claims for patent.

The second cooling portion 232*b* includes a second radiation fin portion 252 having a plurality of fins 252*a* arranged to be separated from and opposed to an outer surface 31*b* corresponding to the side surface (along arrow Y2) of the semiconductor device 31. As shown in FIG. 12, a plurality of hole portions 252*b* for receiving the heat pipes 232*c* is formed in the plurality of fins 252*a*.

As shown in FIGS. 11 and 12, the heat pipes 232*c* are embedded in hole portions 41*a* formed in a heat slinger 41 and arranged to pass through the hole portions 252*b* formed in the plurality of fins 252*a*. The heat pipes 232*c* are so configured that portions extending in a Y-axis direction have alternate lengths between the adjacent ones of the heat pipes 232*c*, as shown in FIG. 12. Following this, the hole portions 252*b* formed in the plurality of fins 252*a* are provided to align with each other toward an X-axis direction at positions alternately deviating from each other in the Y-axis direction. The heat pipes 232*c* are fixed by brazing in a state passing through the hole portions 252*b* formed in the plurality of fins 252*a*. In other words, the heat pipes 232*c* are directly connected to the plurality of fins 252*a*.

As shown in FIG. 11, the cooling portion 232 further includes a fixture 34 for fixing the heat pipes 232*c* to a spacer 33 and a heat pipe protector 35 for protecting portions where the heat pipes 232*c* are exposed.

The fixture 34 is provided in the form of an L-shaped plate as viewed from the X-axis direction. The fixture 34 is provided with hole portions (not shown) for receiving the heat pipes 232*c* on one side of the L shape, and fixed to the heat pipes 232*c*. Further, the fixture 34 is provided with a through-hole (not shown) for receiving a bolt 70 on another side of the L shape, and fixed to the spacer 33 through the bolt 70. Thus, the second radiation fin portion 252 is easily maintained in a state separated from and opposed to the outer surface 31*b* corresponding to the side surface (along arrow Y2) of the semiconductor device 31, due to the spacer 33 held between the same and the outer surface 31*b*.

The heat pipe protector 35 is arranged in the vicinity of portions where the L-shaped heat pipes 232*c* are bent. The heat pipe protector 35 partially covers portions of the heat pipes 232*c* not covered with the heat slinger 41 and the second radiation fin portion 252, thereby inhibiting the L-shaped heat pipes 232*c* from receiving external impacts.

The remaining structure of the second embodiment is similar to that of the aforementioned first embodiment.

Effects of Second Embodiment

In the power converter 230 according to the second embodiment, as hereinabove described, the cooling portion 232 is configured to include the first cooling portion 32*a* having the first radiation portion 51 for blocking up an opening 31*c* while ensuring watertightness and arranged to come into contact with semiconductor elements 18 through the opening 31*c* and the second cooling portion 232*b* having the second radiation fin portion 252 and provided to be opposed to the outer surface 31*b* of the side of the semiconductor device 31 not provided with the opening 31*c* and adjacent to the side provided with the first cooling portion 32*a*. Thus, watertightness of the semiconductor device 31 can be ensured by simply applying a waterproof structure to only on one surface as compared with a case where waterproof structures must be applied to a plurality of surfaces respectively, similarly to the power converter 30 according to the first embodiment. Consequently, the number of manufacturing steps and labor for maintenance resulting from application of a waterproof structure can be reduced while ensuring a heat radiation performance in the power converter 230, similarly to the power converter 30 according to the first embodiment.

In the power converter 230 according to the second embodiment, as hereinabove described, the second cooling portion 232*b* is arranged to be separated from and opposed to the outer surface 31*b* of the semiconductor device 31. Thus, heat can be radiated from the second cooling portion 232*b* also between the second cooling portion 232*b* and the outer surface 31*b* of the semiconductor device 31 separated from and opposed to each other. Further, the second cooling portion 232*b* is so separated from the outer surface 31*b* of the semiconductor device 31 that heat radiated from the second cooling portion 232*b* can be inhibited from being transferred to the semiconductor device 31 from the outer surface 31*b* thereof. Consequently, heat radiation can be efficiently performed in the cooling portion 232, whereby a heat radiation performance of the cooling portion 232 can be reliably ensured also in the case where the opening 31*c* is formed only on the side of the semiconductor device 31 provided with the first cooling portion 32*a*. Further, the heat pipes 232*c* are directly connected to the plurality of fins 252a, whereby heat transferred to the second cooling portion 232b through the heat pipes 232c can be efficiently radiated.

The remaining effects of the second embodiment are similar to those of the aforementioned first embodiment.

Third Embodiment

A third embodiment of the present invention is now described with reference to FIG. 13. According to the third embodiment, an opening 331c is provided on a side surface (along arrow Y2) of a semiconductor device 331, dissimilarly to the aforementioned first embodiment having the opening 31c provided on the lower surface (along arrow Z1) of the semiconductor device 31. The semiconductor device 331 is an example of the "power converter body" in the scope of claims for patent. Referring to FIG. 13, structures similar to those of the aforementioned first embodiment are denoted by the same reference signs.

A power converter 330 according to the third embodiment of the present invention includes the semiconductor device 331 and a cooling portion 332, as shown in FIG. 13. The semiconductor device 331 is provided therein with electronic components such as semiconductor elements 318. The opening 331c is provided only on an outer surface 331a corresponding to the side surface (along arrow Y2) of the semiconductor device 331. The power converter 330 is an example of the "power converter for a railroad vehicle" in the scope of claims for patent.

The cooling portion 332 includes a first cooling portion 332a provided on the side surface (along arrow Y2) of the semiconductor device 331, a second cooling portion 332b provided on the lower surface (along arrow Z1) of the semiconductor device 331 and a plurality of heat pipes 332c arranged across the first and second cooling portions 332a and 332b, as shown in FIG. 13. The lower surface (along arrow Z1) of the semiconductor device 331 provided with the second cooling portion 332b is adjacent to the side surface (along arrow Y2) of the semiconductor device 331 provided with the first cooling portion 332a. The heat pipes 332c are examples of the "pipelike member" in the scope of claims for patent.

The first cooling portion 332a is arranged to come into contact with the outer surface 331a corresponding to the side surface (along arrow Y2) of the semiconductor device 331. Further, the first cooling portion 332a is arranged to come into contact with the semiconductor elements 318 through the opening 331c.

The second cooling portion 332b is separated from and opposed to another outer surface 331b corresponding to the lower surface (along arrow Z1) of the semiconductor device 331, due to a spacer 333 held between the same and the outer surface 331b.

The heat pipes 332c are configured to efficiently transfer heat generated from the semiconductor device 331 also to the second cooling portion 332b to which this heat is not directly transferred, similarly to the heat pipes 32c according to the first embodiment.

The power converter 330 according to the third embodiment is formed by replacing the structure of the power converter 30 according to the first embodiment having the opening 31c formed on the outer surface 31a (along arrow Z1) of the semiconductor device 31 with the structure where the opening 331c is formed on the outer surface 331a corresponding to the side surface (along arrow Y2) of the semiconductor device 331. In other words, the power converter 330 according to the third embodiment is formed by replacing the structure of the power converter 30 according to the first embodiment having the first and second cooling portions 32a and 32b provided on the lower surface (along arrow Z1) and the side surface (along arrow Y2) of the semiconductor device 31 with the structure where the first and second cooling portions 332a and 332b are provided on the side surface (along arrow Y2) and the lower surface (along arrow Z1) of the semiconductor device 331 respectively. Therefore, the remaining structure of the power converter 330 according to the third embodiment is similar to that of the aforementioned first embodiment.

Effects of Third Embodiment

In the power converter 330 according to the third embodiment, as hereinabove described, the cooling portion 332 is configured to include the first cooling portion 332a arranged to block up the opening 331c while ensuring watertightness and to come into contact with the semiconductor elements 318 through the opening 331c and the second cooling portion 332b provided to be opposed to the outer surface 331b corresponding to the side of the semiconductor device 331 not provided with the opening 331c and adjacent to the side provided with the first cooling portion 332a. Thus, watertightness of the semiconductor device 331 can be ensured by simply applying a waterproof structure to only one surface as compared with a case where waterproof structures must be applied to a plurality of surfaces respectively, similarly to the power converter 30 according to the first embodiment. Consequently, the number of manufacturing steps and labor for maintenance resulting from application of a waterproof structure can be reduced while ensuring a heat radiation performance in the power converter 330, similarly to the power converter 30 according to the first embodiment.

The remaining effects of the third embodiment are similar to that of the aforementioned first embodiment.

Fourth Embodiment

A fourth embodiment of the present invention is now described with reference to FIG. 14. According to the fourth embodiment, an opening 431c is provided on the upper surface (along arrow Z2) of a semiconductor device 431, dissimilarly to the aforementioned first embodiment having the opening 31c provided on the lower surface (along arrow Z1) of the semiconductor device 31. The semiconductor device 431 is an example of the "power converter body" in the scope of claims for patent. Referring to FIG. 14, structures similar to those of the aforementioned first embodiment are denoted by the same reference signs.

A power converter 430 according to the fourth embodiment of the present invention includes the semiconductor device 431 and a cooling portion 432, as shown in FIG. 14. The semiconductor device 431 is provided therein with electronic components such as semiconductor elements 418. The opening 431c is formed only on an outer surface 431a corresponding to the upper surface (along arrow Z2) of the semiconductor device 431. The power converter 430 is an example of the "power converter for a railroad vehicle" in the scope of claims for patent.

The cooling portion 432 includes a first cooling portion 432a provided on the upper surface (along arrow Z2) of the semiconductor device 431, a second cooling portion 432b provided on a side surface (along arrow Y2) of the semiconductor device 431 and a plurality of heat pipes 432c arranged across the first and second cooling portions 432a and 432b. The side surface (along arrow Y2) of the semiconductor device 431 provided with the second cooling portion 432b is adjacent to the upper surface (along arrow Z2) of the semiconductor device 431 provided with the first cooling portion 432a. The heat pipes 432c are examples of the "pipelike member" in the scope of claims for patent.

The first cooling portion 432a is arranged to come into contact with the outer surface 431a corresponding to the upper surface (along arrow Z2) of the semiconductor device 431. Further, the first cooling portion 432a is arranged to come into contact with the semiconductor elements 418 through the opening 431c.

The second cooling portion 432b is arranged to be separated from and opposed to the outer surface 431a corresponding to the upper surface (along arrow Z2) of the semiconductor device 431, due to a spacer 433 held between the same and the outer surface 431a.

The heat pipes 432c are configured to efficiently transfer heat generated from the semiconductor device 431 also to the second cooling portion 432b to which this heat is not directly transferred, similarly to the heat pipes 32c according to the first embodiment.

The power converter 430 according to the fourth embodiment is formed by replacing the structure of the power converter 30 according to the first embodiment having the opening 31c formed on the outer surface 31a (along arrow Z1) of the semiconductor device 31 with the structure where the opening 431c is formed on the outer surface 431a corresponding to the upper surface (along arrow Z2) of the semiconductor device 431. In other words, the power converter 430 according to the fourth embodiment is formed by replacing the structure of the power converter 30 according to the first embodiment having the first and second cooling portions 32a and 32b provided on the lower surface (along arrow Z1) and the side surface (along arrow Y2) of the semiconductor device 31 with the structure where the first and second cooling portions 432a and 432b are provided on the upper surface (along arrow Z2) and the side surface (along arrow Y2) of the semiconductor device 431 respectively. Therefore, the remaining structure of the power converter 430 according to the fourth embodiment is similar to that according to the aforementioned first embodiment.

Effects of Fourth Embodiment

In the power converter 430 according to the fourth embodiment, as hereinabove described, the cooling portion 432 is configured to include the first cooling portion 432a arranged to block up the opening 431c while ensuring watertightness and to come into contact with the semiconductor elements 418 through the opening 431c and the second cooling portion 432b provided to be opposed to the outer surface 431b of the side of the semiconductor device 431 not provided with the opening 431c and adjacent to the side provided with the first cooling portion 432a. Thus, watertightness of the semiconductor device 431 can be ensured by simply applying a waterproof structure to only one surface as compared with a case where waterproof structures must be applied to a plurality of surfaces respectively, similarly to the power converter 30 according to the first embodiment. Consequently, the number of manufacturing steps and labor for maintenance resulting from application of a waterproof structure can be reduced while ensuring a heat radiation performance in the power converter 430, similarly to the power converter 30 according to the first embodiment.

The remaining effects of the fourth embodiment are similar to those of the aforementioned first embodiment.

Fifth Embodiment

Figure 15:
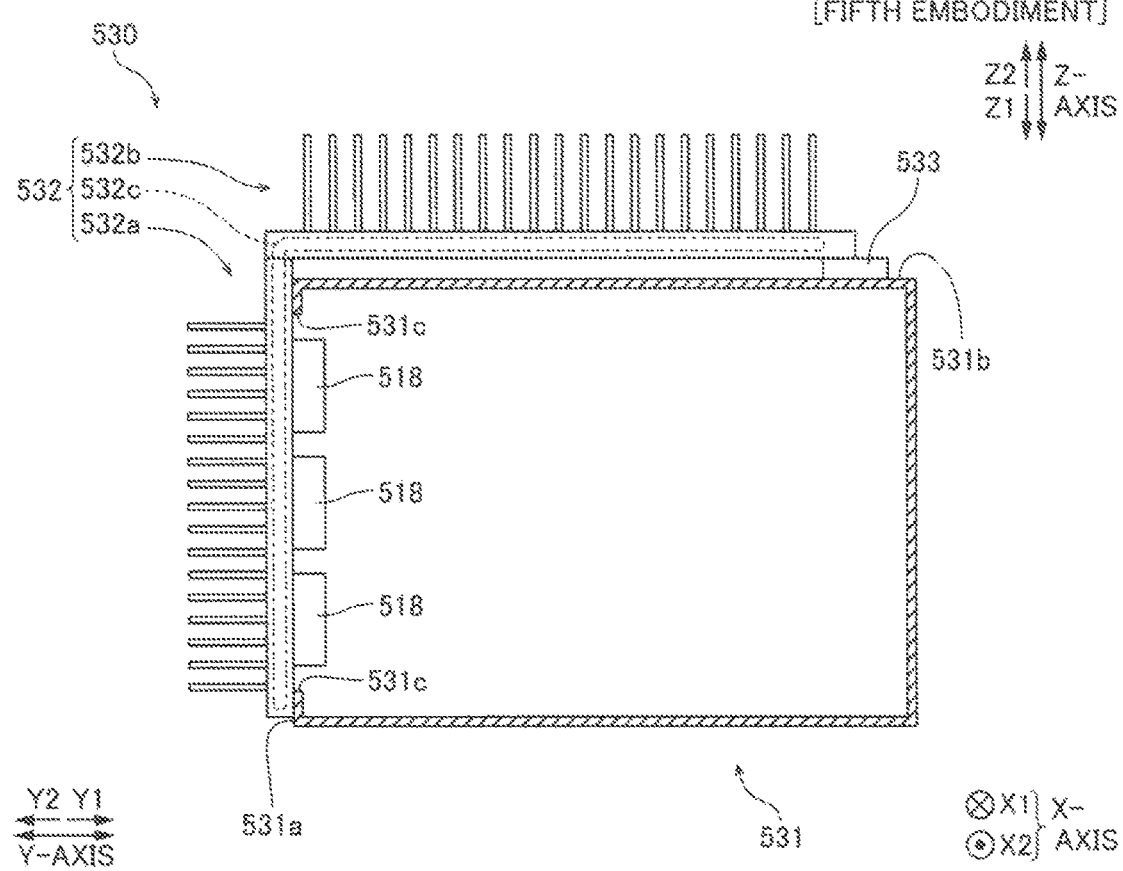
FIG. 15 is a side sectional view showing a power converter according to a fifth embodiment of the present invention.

A fifth embodiment of the present invention is now described with reference to FIG. 15. According to the fifth embodiment, an opening 531c is provided on a side surface (along arrow Y2) of a semiconductor device 531, dissimilarly to the aforementioned fourth embodiment having the opening 431c provided on the upper surface (along arrow Z2) of the semiconductor device 431. The semiconductor device 531 is an example of the "power converter body" in the scope of claims for patent. Referring to FIG. 15, structures similar to those of the aforementioned fourth embodiment are denoted by the same reference signs.

A power converter 530 according to the fifth embodiment of the present invention includes the semiconductor device 531 and a cooling portion 532, as shown in FIG. 15. The semiconductor device 531 is provided therein with electronic components such as semiconductor elements 518. The opening 531c is formed only on an outer surface 531a corresponding to the side surface (along arrow Y2) of the semiconductor device 531. The power converter 530 is an example of the "power converter for a railroad vehicle" in the scope of claims for patent.

The cooling portion 532 includes a first cooling portion 532a provided on the side surface (along arrow Y2) of the semiconductor device 531, a second cooling portion 532b provided on the upper surface (along arrow Z2) of the semiconductor device 531 and a plurality of heat pipes 532c arranged across the first and second cooling portions 532a and 532b. The upper surface (along arrow Z2) of the semiconductor device 531 provided with the second cooling portion 532b is adjacent to the side surface (along arrow Y2) of the semiconductor device 531 provided with the first cooling portion 532a. The heat pipes 532c are examples of the "pipelike member" in the scope of claims for patent.

The first cooling portion 532a is arranged to come into contact with the outer surface 531a corresponding to the side surface (along arrow Y2) of the semiconductor device 531. Further, the first cooling portion 532a is arranged to come into contact with the semiconductor elements 518 through the opening 531c.

The second cooling portion 532b is arranged to be separated from and opposed to the outer surface 531b corresponding to the upper surface (along arrow Z2) of the semiconductor device 531, due to a spacer 533 held between the same and the outer surface 531b.

The heat pipes 532c are configured to efficiently transfer heat generated from the semiconductor device 531 also to the second cooling portion 532b to which this heat is not directly transferred, similarly to the heat pipes 432c according to the fourth embodiment.

The power converter 530 according to the fifth embodiment is formed by replacing the structure of the power converter 430 according to the fourth embodiment having the opening 431c formed on the outer surface 431a (along arrow Z2) of the semiconductor device 431 with the structure where the opening 531c is formed on the outer surface 531a corresponding to the side surface (along arrow Y2) of the semiconductor device 531. In other words, the power converter 530 according to the fifth embodiment is formed by replacing the structure of the power converter 430 according to the fourth embodiment having the first and second cooling portions 432a and 432b provided on the upper surface (along arrow Z2) and the side surface (along arrow Y2) of the semiconductor device 431 with the structure where the first and second cooling portions 532a and 532b are provided on the side surface (along arrow Y2) and the upper surface (along arrow Z2) of the semiconductor device 531 respectively. Therefore, the remaining structure of the power converter 530 according to the fifth embodiment is similar to that of the aforementioned fourth embodiment.

Effects of Fifth Embodiment

In the power converter 530 according to the fifth embodiment, as hereinabove described, the cooling portion 532 is configured to include the first cooling portion 532a arranged to block up the opening 531c while ensuring watertightness and to come into contact with the semiconductor elements 518 through the opening 531c and the second cooling portion 532b provided to be opposed to the outer surface 531b of the side of the semiconductor device 531 not provided with the opening 531c and adjacent to the side provided with the first cooling portion 532a. Thus, watertightness of the semiconductor device 531 can be ensured by simply applying a waterproof structure to only one surface as compared with a case where waterproof structures must be applied to a plurality of surfaces respectively, similarly to the power converter 430 according to the fourth embodiment. Consequently, the number of manufacturing steps and labor for maintenance resulting from application of a waterproof structure can be reduced while ensuring a heat radiation performance in the power converter 530, similarly to the power converter 430 according to the fourth embodiment.

The remaining effects of the fifth embodiment are similar to those of the aforementioned fourth embodiment.

Modifications

The embodiments disclosed this time must be considered as illustrative in all points and not restrictive. The range of the present invention is shown not by the description of the aforementioned embodiments but by the scope of claims for patent, and all alterations (modifications) within the meaning and range equivalent to the scope of claims for patent are included.

For example, while the second cooling portion (32b, 232b, 432b) is provided on the side surface (along arrow Y2) of the semiconductor device (31, 431) in each of the aforementioned first, second and fourth embodiments, the present invention is not restricted to this. According to the present invention, the second cooling portion may alternatively be provided on another side surface (along arrow Y1) of the semiconductor device.

While the first cooling portion (332a, 532a) is provided on the side surface (along arrow Y2) of the semiconductor device (331, 531) in each of the aforementioned third and fifth embodiments, the present invention is not restricted to this. According to the present invention, the first cooling portion may alternatively be provided on another side surface (along arrow Y1) of the semiconductor device.

While the cooling portion (32, 232, 332, 432, 532) includes the first cooling portion (32a, 232a, 332a, 432a, 532a) provided on the side of the semiconductor device (31, 331, 431, 531) having the opening (31c, 331c, 431c, 531c) and the second cooling portion (32b, 232b, 332b, 432b, 532b) provided on one side of the semiconductor device (31, 331, 431, 531) adjacent to the side provided with the first cooling portion (32a, 332a, 432a, 532a) in each of the aforementioned first to fifth embodiments, the present invention is not restricted to this. According to the present invention, second cooling portions may alternatively be provided on both sides of the semiconductor device adjacent to the side provided with the first cooling portion. When the opening of the semiconductor device is formed on the lower surface thereof, for example, the first cooling portion may be provided on the lower surface (along arrow Z1) of the semiconductor device, and second cooling portions may be provided on both side surfaces (along arrows Y1 and Y2) of the semiconductor device respectively.

Figure 16:
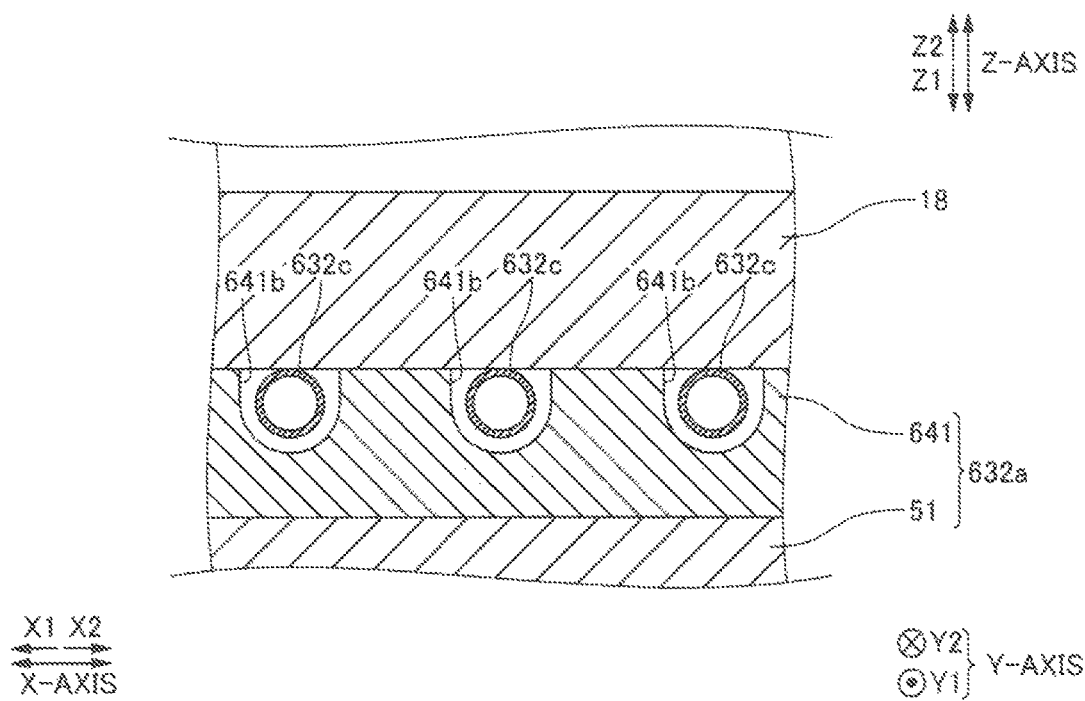
FIG. 16 is a sectional view showing a state of pipelike members of a power converter according to a modification of the present invention.

While the heat pipes (32c, 232c, 332c, 432c, 532c) are arranged to be embedded in the hole portions 41a formed in the heat slinger 41 in each of the aforementioned first to fifth embodiments, the present invention is not restricted to this. According to the present invention, the heat pipes may alternatively be arranged to come into contact with the semiconductor elements 18. For example, a first cooling portion 632a may be configured to include a heat slinger 641 having grooves 641b opened toward semiconductor elements 18 so that heat pipes 632c are embedded in the grooves 641b through thermal compounds, as shown in FIG. 16. Thus, heat generated from the semiconductor elements 18 can be easily transferred to the heat pipes 632c. In this case, the semiconductor elements 18 and the heat pipes 632c are preferably fixed to each other through screws, brackets or the like.

Figure 17:
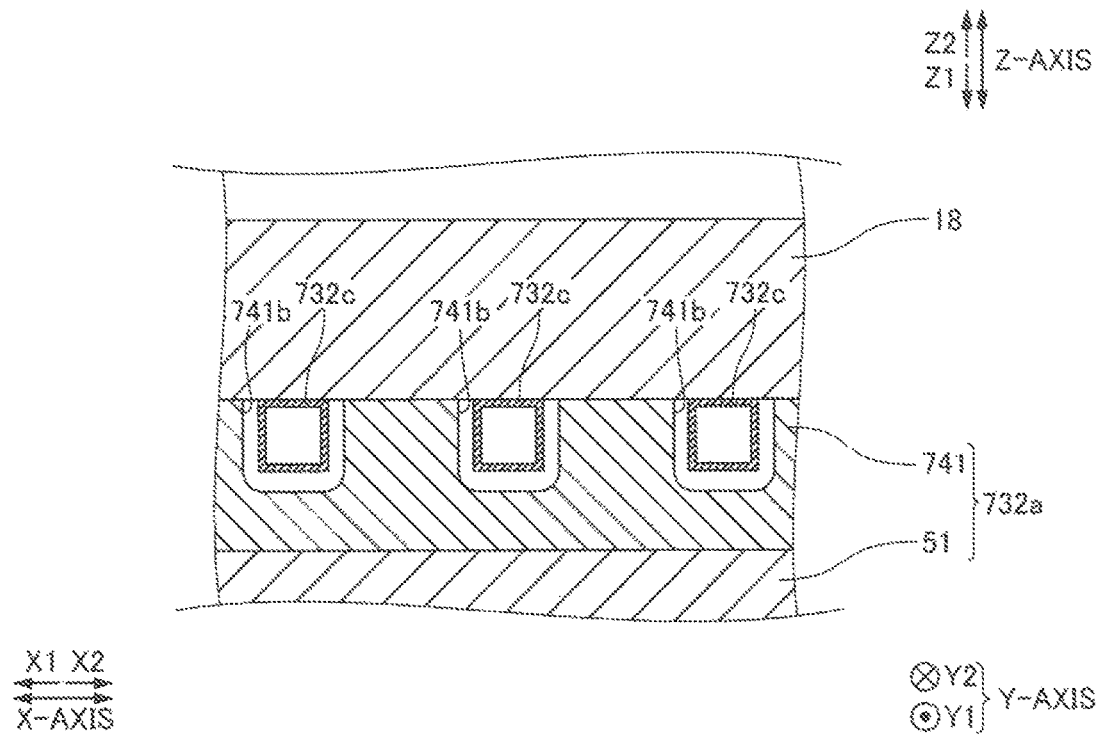
FIG. 17 is a sectional view showing a state of other pipelike members of the power converter according to the modification of the present invention.

While the heat pipes (32c, 232c, 332c, 432c, 532c) are formed to have circular sections in each of the aforementioned first to fifth embodiments, the present invention is not restricted to this. According to the present invention, heat pipes may alternatively have rectangular sections. For example, a first cooling portion 732a may be configured to include a heat slinger 741 provided with grooves 741b opened toward semiconductor elements 18 and having substantially rectangular sections so that heat pipes 632c are embedded in the grooves 741b through thermal compounds, as shown in FIG. 17. Further, the heat pipes 732c may be arranged to come into contact with the semiconductor elements 18, as shown in FIG. 17. Thus, contact areas between the heat pipes 732 and the semiconductor elements 18 can be increased as compared with the heat pipes 32c having circular sections, whereby heat generated from the semiconductor elements 18 can be efficiently transferred to the heat pipes 732. Also in this case, the semiconductor elements 18 and the heat pipes 732c are preferably fixed to each other through screws, brackets or the like.

Figure 18A:
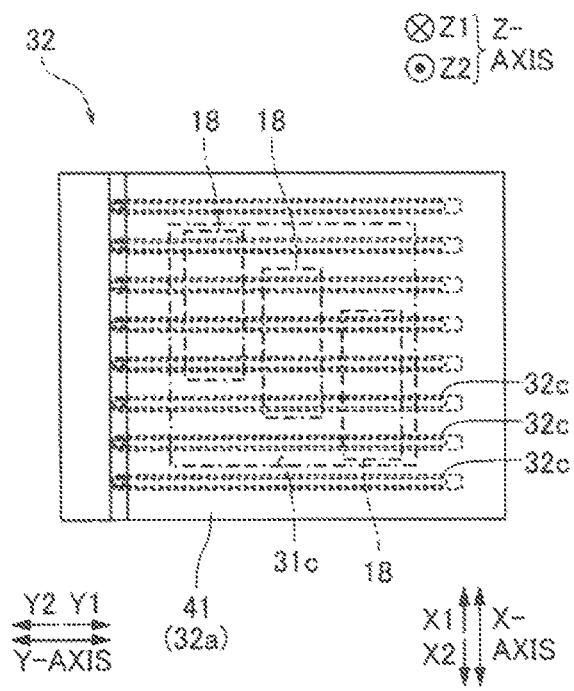
FIG. 18A is a plan view for illustrating an arrangement of semiconductor elements of the power converter according to the modification of the present invention.
Figure 18B:
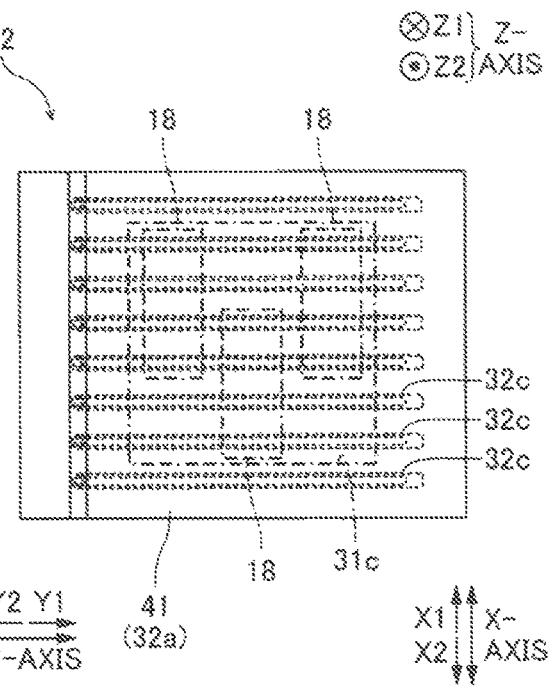
FIG. 18B is a plan view for illustrating another arrangement of the semiconductor elements of the power converter according to the modification of the present invention.

While the semiconductor elements 18 are arranged in line along the crosstie direction (Y-axis direction) so that the longitudinal direction thereof is along the traveling direction (X-axis direction) of the railroad vehicle 10 and the positions in the traveling direction (X-axis direction) align with each other in each of the aforementioned first to fifth embodiments, the present invention is not restricted to this. According to the present invention, semiconductor elements 18 may alternatively be arranged so that positions in the traveling direction deviate from each other, as shown in FIGS. 18A and 18B. Thus, the semiconductor elements 18 can be arranged partially not to overlap with each other as viewed from the crosstie direction, whereby the semiconductor elements 18 can be protected against influence by heat received from those adjacent thereto. In particular, the central one of three aligning semiconductor elements 18 can be protected against influence by heat received from those on both sides thereof.

Figure 19:
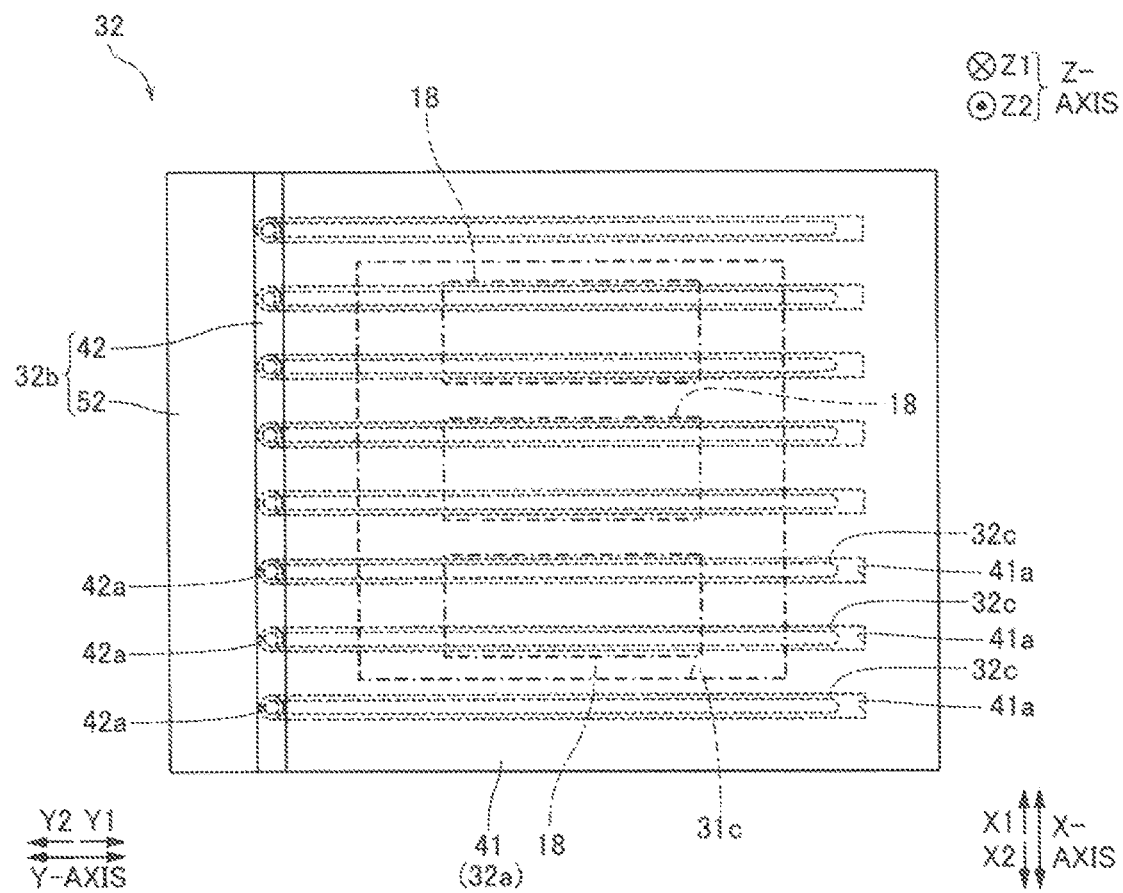
FIG. 19 is a plan view for illustrating an arrangement of the semiconductor elements of the power converter according to the modification of the present invention in a case of arranging the semiconductor elements in a traveling direction of a railroad vehicle.
Figure 20A:
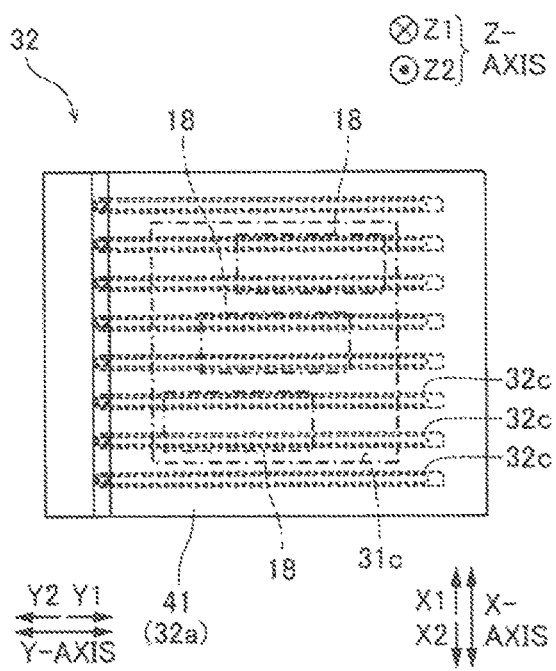
FIG. 20A is a plan view for illustrating another arrangement of the semiconductor elements of the power converter according to the modification of the present invention in the case of arranging the semiconductor elements in the traveling direction of the railroad vehicle.
Figure 20B:
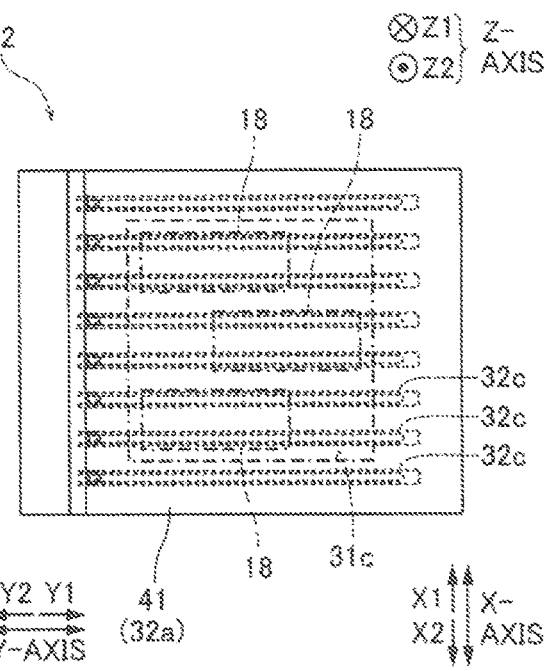
FIG. 20B is a plan view for illustrating still another arrangement of the semiconductor elements of the power converter according to the modification of the present invention in the case of arranging the semiconductor elements in the traveling direction of the railroad vehicle.

While the semiconductor elements 18 are arranged in line along the crosstie direction (Y-axis direction) so that the longitudinal direction thereof is along the traveling direction (X-axis direction) of the railroad vehicle 10 and the positions in the traveling direction (X-axis direction) align with each other in each of the aforementioned first to fifth embodiments, the present invention is not restricted to this. According to the present invention, semiconductor elements 18 may alternatively be arranged in line along the traveling direction of a railroad vehicle 10 so that the longitudinal direction thereof is along the crosstie direction, as shown in FIG. 19. In this case, the semiconductor elements 18 may be so arranged that the positions in the crosstie direction deviate from each other, as shown in FIGS. 20A and 20B. Thus, the semiconductor elements 18 can be arranged partially not to overlap with each other as viewed from the traveling direction, whereby leeward semiconductor elements 18 can be protected against influence from heat received from windward semiconductor elements 18.

While the annular waterproof gasket 60 is configured to be fitted into the space between the recess portion 31d formed on the outer surface 31a corresponding to the lower surface (along arrow Z1) of the semiconductor device 31 to dent along arrow Z2 and the projecting portion 41b formed on the surface of the heat slinger 41 closer to the semiconductor device 31 to protrude along arrow Z2 in the vicinity of the outer peripheral portion of the opening 31c of the semiconductor device 31 in each of the aforementioned first to fifth embodiments, the present invention is not restricted to this. According to the present invention, the waterproof gasket 60 may alternatively be configured to be fitted into a space between a projecting portion formed on the outer surface 31a corresponding to the lower surface (along arrow Z1) of the semiconductor device 31 to protrude along arrow Z1 and a recess portion formed on the surface of the heat slinger 41 closer to the semiconductor device 31 to dent along arrow Z1. Further, still another mounting structure may be applied to the waterproof gasket 60, so far as the same can ensure watertightness between the semiconductor device 31 and the first cooling portion 32a.

While two cooling portions (32, 232, 332, 432, 532) are arranged at a prescribed interval along the X-axis direction corresponding to the extensional direction of the vehicle body 11 in the power converter (30, 230, 330, 430, 530) in each of the aforementioned first to fifth embodiments, the present invention is not restricted to this. According to the present invention, the power converter may alternatively be provided with one cooling portion or at least three cooling portions.

While the present invention is applied to the power converter 30, 230, 330, 430 or 530 set in the underfloor space 11a of the vehicle body 11 in each of the aforementioned first to fifth embodiments, the present invention is not restricted to this. The present invention may alternatively be applied to a power converter set on the roof of the vehicle body 11, for example.

While the present invention is applied to the power converter 30, 230, 330, 430 or 530 for the overhead wire-type railroad vehicle 10 traveling through power received from the overhead wire 2 in each of the aforementioned first to fifth embodiments, the present invention is not restricted to this. The present invention may alternatively be applied to a power converter for a third rail-system railroad vehicle 10 having a collector shoe provided on a vehicle body 11 for rubbing against third feeding rails (third rails) laid in parallel independently of traveling rails and thereby collecting electricity.

While the present invention is applied to the power converter 30, 230, 330, 430 or 530 for the overhead wire-type railroad vehicle 10 traveling through power received from the overhead wire 2 in each of the aforementioned first to fifth embodiments, the present invention is not restricted to this. In other words, the present invention may alternatively be applied for cooling a power converter loaded on an internal combustion railcar having a diesel engine as a direct driving source or a power converter for a railroad vehicle 10 such as an electric internal combustion railcar rotating induction motors 15 by power generation of a diesel engine.

What is claimed is:

1. A power converter for a railroad vehicle comprising:
   a power converter body adapted to be loaded on a railroad vehicle and provided therein with a semiconductor element; and
   a cooling portion provided outside the power converter body for radiating heat from an inside of the power converter body, wherein
   the power converter body includes a first surface at one of upper, lower and side surfaces and a second surface at another of upper, lower and side surfaces that is adjacent to and different from the first surface,
   an opening is formed only on an outer surface of the first surface, and
   the cooling portion includes a first cooling portion having a first radiation fin portion and arranged on the first surface to block the opening while ensuring watertightness and to come into contact with the semiconductor element through the opening, and a second cooling portion having a second radiation fin portion and provided to be opposed to an outer surface of the second surface not provided with the opening.

2. The power converter for a railroad vehicle according to claim 1, wherein
   the second cooling portion is arranged to be separated from and opposed to the outer surface of the second surface of the power converter body.

3. The power converter for a railroad vehicle according to claim 2, further comprising a spacer provided between the second cooling portion and the outer surface of the second surface of the power converter body.

4. The power converter for a railroad vehicle according to claim 1, wherein
   the cooling portion further includes a pipe member arranged across the first cooling portion and the second cooling portion, and
   the pipe member is configured to perform heat conduction between the first cooling portion provided to come into contact with the semiconductor element for directly receiving heat from the inside of the power converter body and the second cooling portion.

5. The power converter for a railroad vehicle according to claim 4, wherein
   the pipe member is provided to come into contact with the semiconductor element.

6. The power converter for a railroad vehicle according to claim 5, wherein
   the pipe member is formed to have a rectangular section.

7. The power converter for a railroad vehicle according to claim 1, further comprising an annular waterproof member provided between the power converter body and the first cooling portion to ensure watertightness in a vicinity of an outer peripheral portion of the opening.

8. The power converter for a railroad vehicle according to claim 1, wherein
the first cooling portion and the second cooling portion are connected to form an L-shape such that the first radiation fin portion and the second radiation fin portion protrude in directions different from each other.

* * * * *